US012692424B2

(12) United States Patent
Yamazaki

(10) Patent No.: US 12,692,424 B2

(45) **Date of Patent: *Jul. 28, 2026**

(54) CURABLE SILICONE COMPOSITION, CURED PRODUCT OF SAME, AND METHOD FOR PRODUCING SAME

(71) Applicant: DOW TORAY CO., LTD., Tokyo (JP)

(72) Inventor: Ryosuke Yamazaki, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 1343 days.

This patent is subject to a terminal disclaimer.

(21) Appl. No.: 17/442,664

(22) PCT Filed: Mar. 18, 2020

(86) PCT No.: PCT/JP2020/012030

§ 371 (c)(1), (2) Date: Sep. 24, 2021

(87) PCT Pub. No.: WO2020/203307

PCT Pub. Date: Oct. 8, 2020

(65) Prior Publication Data

US 2022/0195269 A1 Jun. 23, 2022

(30) Foreign Application Priority Data

Mar. 29, 2019 (JP) ................................ 2019-066557

(51) Int. Cl.

*C09J 183/04* (2006.01)
*B29C 43/00* (2006.01)
*B29C 43/24* (2006.01)
*B29C 43/28* (2006.01)
*B29C 43/30* (2006.01)

(Continued)

(52) U.S. Cl.

CPC ........... *C09J 183/04* (2013.01); *B29C 43/003* (2013.01); *B29C 43/24* (2013.01); *B29C 43/28* (2013.01); *B29C 43/305* (2013.01); *B29C 45/0001* (2013.01); *B29C 45/14* (2013.01); *C08L 83/04* (2013.01); *C09J 5/06* (2013.01); *C09J 7/35* (2018.01); *C09J 11/04* (2013.01); *B29K 2083/00* (2013.01); *B29L 2007/002* (2013.01); *B29L 2031/34* (2013.01); *C08L 2203/20* (2013.01); *C08L 2205/035* (2013.01); *C09J 2203/326* (2013.01); *C09J 2400/16* (2013.01); *C09J 2483/00* (2013.01); *H10W 74/476* (2026.01)

(58) Field of Classification Search

CPC ....... B29C 43/003; B29C 43/24; B29C 43/28; B29C 43/305; B29C 45/0001; B29C 45/14; B29C 55/02; B29C 45/14639; B32B 27/20; B32B 27/26; B32B 27/283; B32B 2250/40; B32B 2264/0214; B32B 2264/202; B32B 2307/732; B32B 2307/748; B32B 2405/00; B32B 2457/14; B32B 7/06; B32B 7/12; C08J 5/18; C08K 3/013; C08K 5/14; C08K 5/54; C08K 2003/2227; C09J 5/18; C09J 7/10; C09J 5/06; C09J 7/35; C09J 11/04; C09J 183/04; C09J 2203/326; C09J 2400/16; C09J 2483/00; C08L 83/04; C08L 2205/025; C08L 2205/035; B29K 2083/00; B29L 2007/002; B29L 2031/34; C08G 77/12; C08G 77/20; H01L 21/565; H01L 23/296

See application file for complete search history.

(56) References Cited

U.S. PATENT DOCUMENTS 4,293,671 A * 10/1981 Sasaki .................... C08L 83/04 528/31
4,919,843 A * 4/1990 Innertsberger ..... B01D 19/0409 528/33

(Continued)

FOREIGN PATENT DOCUMENTS

| | | | |
|---|---|---|---|
| AU | 618818 | B2 | 1/1992 |
| CN | 101151328 | A | 3/2008 |

(Continued)

OTHER PUBLICATIONS

International Search Report for PCT/JP2020/012030 dated Jun. 9, 2020, 2 pages.

(Continued)

*Primary Examiner* — Kevin R Kruer

(74) *Attorney, Agent, or Firm* — Warner Norcross + Judd LLP

(57) ABSTRACT

Provided is a curable silicone composition and uses thereof. The composition has hot-melt properties, strongly adheres to difficult-to-adhere to base materials, is particularly superior in flexibility and toughness at high temperatures from room temperature to about 150° C. in cured products such as overmolding, and provides a cured product that does not easily warp or become damaged even when integrally molded with a lead frame or the like. The composition comprises: (A1) an organopolysiloxane resin having no hot-melt properties as a whole molecule and contains 20 mol % or more of a siloxane unit represented by $SiO_{4/2}$, (A2) a liquid chain organopolysiloxane having at least two curing-reactive functional groups in the molecule, (B) a silatrane derivative or carbasilatrane derivative, (C) a curing agent, and (D) a functional inorganic filler. The content of component (D) is at least 10% by volume. The composition has hot-melt properties at a temperature of 200° C. or lower.

19 Claims, No Drawings

(51) Int. Cl.

| | |
|---|---|
| ***B29C 45/00*** | (2006.01) |
| ***B29C 45/14*** | (2006.01) |
| ***C08L 83/04*** | (2006.01) |
| ***C09J 5/06*** | (2006.01) |
| ***C09J 7/35*** | (2018.01) |
| ***C09J 11/04*** | (2006.01) |
| *B29K 83/00* | (2006.01) |
| *B29L 7/00* | (2006.01) |
| *B29L 31/34* | (2006.01) |
| *H10W 74/47* | (2026.01) |

(56) References Cited

U.S. PATENT DOCUMENTS 5,100,976 A 3/1992 Hamada et al.
5,145,886 A 9/1992 Oxman et al.
5,153,238 A * 10/1992 Bilgrien ................... C08J 3/124 524/588
5,169,727 A 12/1992 Boardman
5,308,887 A * 5/1994 Ko ............................ C09J 4/00 526/279
5,357,007 A 10/1994 Wengrovius et al.
5,392,592 A 2/1995 Bozich et al.
5,696,209 A * 12/1997 King ...................... C09J 183/04 528/21
5,705,587 A * 1/1998 Hatanaka ................ C08L 83/04 528/901
5,705,592 A * 1/1998 Sejpka ..................... C09G 1/16 524/588
5,844,060 A * 12/1998 Furuya .................. C08G 77/06 528/30
5,977,243 A 11/1999 Barthel et al.
5,994,461 A * 11/1999 Nakamura .............. C08L 83/04 524/588
6,004,679 A * 12/1999 Mitchell ................. B32B 15/20 524/588
6,177,506 B1 1/2001 Takahashi et al.
6,376,569 B1 4/2002 Oxman et al.
6,379,792 B1 4/2002 Isshiki et al.
6,433,055 B1 8/2002 Kleyer et al.
8,124,689 B2 2/2012 Loubert et al.
12,134,697 B2 * 11/2024 Yamazaki .................. C09J 7/10
12,173,157 B2 * 12/2024 Yamazaki .............. C08G 77/44
12,173,202 B2 * 12/2024 Yamazaki ............. H01L 21/565
12,258,496 B2 * 3/2025 Yamazaki .............. C09J 183/04
12,384,941 B2 * 8/2025 Yamazaki ............... B29C 55/02
2001/0018482 A1 * 8/2001 Azechi ..................... H01B 1/22 524/439
2002/0132891 A1 9/2002 Azechi et al.
2004/0265599 A1 12/2004 Ushio et al.
2006/0057779 A1 3/2006 Sutoh et al.
2006/0073347 A1 * 4/2006 Morita ................. C08K 5/5419 428/447
2006/0094834 A1 5/2006 Aoki et al.
2006/0270788 A1 11/2006 Ozai et al.
2008/0319144 A1 12/2008 Morita et al.
2009/0042043 A1 2/2009 Joseph et al.
2009/0075009 A1 3/2009 Fujisawa et al.
2009/0171013 A1 7/2009 Taguchi et al.
2009/0281222 A1 11/2009 Nishiumi et al.
2010/0104865 A1 * 4/2010 Mizuno .................. C09J 183/04 428/355 R
2010/0137529 A1 * 6/2010 Williams ............. C09D 5/1675 525/474
2011/0104506 A1 5/2011 Behl et al.
2011/0236666 A1 9/2011 Hall et al.
2011/0287267 A1 * 11/2011 Hori .......................... C09J 7/40 428/447
2012/0139131 A1 6/2012 Sugo et al.
2013/0183776 A1 7/2013 Kashiwagi et al.
2013/0200554 A1 8/2013 Mueller
2013/0274398 A1 10/2013 Shiobara et al.
2013/0331499 A1 * 12/2013 Hamamoto ............. C08L 83/04 524/500
2014/0060324 A1 * 3/2014 Ahn ..................... B01D 71/701 96/10
2014/0154626 A1 * 6/2014 Bujalski ............... C09D 183/06 430/280.1
2014/0296468 A1 10/2014 Kownacka et al.
2014/0377570 A1 12/2014 Hirai et al.
2015/0115311 A1 4/2015 Yoshida et al.
2015/0124338 A1 5/2015 Mayumi et al.
2015/0183960 A1 7/2015 Yamazaki et al.
2015/0235872 A1 * 8/2015 Yoshida .................. C08L 83/04 264/272.17
2015/0315427 A1 11/2015 Yoshida et al.
2015/0376344 A1 * 12/2015 Dent ...................... C08G 77/08 252/301.36
2015/0376482 A1 12/2015 Bekemeier et al.
2016/0001541 A1 * 1/2016 Rummel .................. C08J 5/243 156/307.3
2016/0185912 A1 * 6/2016 Mizunashi .............. C08L 83/00 428/220
2016/0230005 A1 8/2016 Mayumi et al.
2016/0311980 A1 10/2016 Knoer
2017/0057980 A1 3/2017 Boyer et al.
2017/0058103 A1 3/2017 Fujisawa et al.
2017/0092822 A1 3/2017 Amako et al.
2017/0166701 A1 6/2017 Jo et al.
2017/0190911 A1 * 7/2017 Iimura .................... C08L 83/04
2017/0247590 A1 * 8/2017 Zheng ..................... C08L 83/04
2017/0283613 A1 10/2017 Mochizuki
2017/0355804 A1 12/2017 Fujisawa et al.
2018/0094178 A1 * 4/2018 Yamamoto ........... C09D 183/12
2018/0105692 A1 4/2018 Imaizumi et al.
2018/0208816 A1 7/2018 Yamazaki et al.
2018/0305547 A1 10/2018 Dogen et al.
2019/0106571 A1 * 4/2019 Nakagawa ............. C08L 83/04
2019/0169398 A1 6/2019 Yamazaki
2019/0169435 A1 6/2019 Yamazaki
2019/0177488 A1 * 6/2019 Yamazaki ................ C08K 3/36
2019/0276684 A1 9/2019 Yamazaki et al.
2019/0315926 A1 * 10/2019 Hayashi ................. C08G 77/80
2019/0367744 A1 12/2019 Chevalier et al.
2020/0115595 A1 * 4/2020 Tsuchida ................. C08L 83/04
2020/0123417 A1 * 4/2020 Kodama ................... B32B 7/12
2020/0216671 A1 7/2020 Matsuzaki et al.
2020/0224069 A1 * 7/2020 Itoh ........................... B32B 5/26
2020/0291187 A1 * 9/2020 Beukema ............... C08G 77/06
2020/0308412 A1 * 10/2020 Schneider ............ C01B 33/193
2020/0354615 A1 11/2020 Itoh et al.
2020/0392335 A1 12/2020 Yamazaki
2021/0162704 A1 6/2021 Sreeram et al.
2021/0179783 A1 6/2021 Yoshitake
2021/0179849 A1 6/2021 Yoshitake
2021/0189129 A1 6/2021 Yamazaki et al.
2021/0198489 A1 7/2021 Yoshitake
2021/0269691 A1 9/2021 Itoh et al.
2021/0284888 A1 9/2021 Itoh et al.
2021/0292607 A1 9/2021 Itoh et al.
2022/0002493 A1 1/2022 Sugie et al.
2022/0048230 A1 * 2/2022 Imaizumi ............... C08G 77/70
2022/0049100 A1 * 2/2022 Yamazaki .............. C08G 77/12
2022/0064447 A1 * 3/2022 Yamazaki .............. C08G 77/80
2022/0064491 A1 3/2022 Yamazaki
2022/0089872 A1 3/2022 Fukui et al.
2022/0169894 A1 * 6/2022 Yamazaki .............. C08G 77/70
2022/0186099 A1 * 6/2022 Yamazaki ................. B32B 7/06
2022/0195269 A1 * 6/2022 Yamazaki ............. B32B 27/283
2022/0340756 A1 10/2022 Nishijima et al.
2022/0403114 A1 12/2022 Sugie et al.
2023/0044439 A1 * 2/2023 Yamamoto ............ H01L 23/296
2023/0137947 A1 * 5/2023 Yamazaki .................. C08J 5/18 428/220
2023/0151215 A1 5/2023 Yamazaki et al.
2024/0002605 A1 1/2024 Tanaka et al.

(56) References Cited

U.S. PATENT DOCUMENTS

| | | | |
|---|---|---|---|
| 2024/0052106 | A1 | 2/2024 | Yamazaki et al. |
| 2024/0052220 | A1 | 2/2024 | Yamamoto et al. |

FOREIGN PATENT DOCUMENTS

| | | | |
|---|---|---|---|
| CN | 103849149 | A | 6/2014 |
| CN | 104870585 | A | 8/2015 |
| CN | 106459419 | A | 2/2017 |
| CN | 106715593 | A | 5/2017 |
| CN | 107429062 | A | 12/2017 |
| CN | 108026373 | A | 5/2018 |
| CN | 109844029 | A | 6/2019 |
| EP | 1002834 | A1 | 5/2000 |
| EP | 3954739 | A1 | 2/2022 |
| EP | 4083140 | A1 | 11/2022 |
| EP | 4130157 | A1 | 2/2023 |
| EP | 4269503 | A1 | 11/2023 |
| JP | H0275681 | A | 3/1990 |
| JP | H0625602 | A | 2/1994 |
| JP | H10195085 | A | 7/1998 |
| JP | H11158379 | A | 6/1999 |
| JP | H11279182 | A | 10/1999 |
| JP | H11335572 | A | 12/1999 |
| JP | 2000063681 | A | 2/2000 |
| JP | 2000198929 | A | 7/2000 |
| JP | 2001019933 | A | 1/2001 |
| JP | 2002155261 | A | 5/2002 |
| JP | 2003176462 | A | 6/2003 |
| JP | 2003226812 | A | 8/2003 |
| JP | 2004043814 | A | 2/2004 |
| JP | 2004307691 | A | 11/2004 |
| JP | 2004315571 | A | 11/2004 |
| JP | 2005007331 | A | 1/2005 |
| JP | 2006188593 | A | 7/2006 |
| JP | 2006274007 | A | 10/2006 |
| JP | 2007119768 | A | 5/2007 |
| JP | 2007231039 | A | 9/2007 |
| JP | 2009503133 | A | 1/2009 |
| JP | 2009132797 | A | 6/2009 |
| JP | 2009155415 | A | 7/2009 |
| JP | 2010047646 | A | 3/2010 |
| JP | 2010047676 | A | 3/2010 |
| JP | 2010509088 | A | 3/2010 |
| JP | 2011525444 | A | 9/2011 |
| JP | 2012017427 | A | 1/2012 |
| JP | 2013076050 | A | 4/2013 |
| JP | 2013523482 | A | 6/2013 |
| JP | 2013147546 | A | 8/2013 |
| JP | 2013221075 | A | 10/2013 |
| JP | 2013221082 | A | 10/2013 |
| JP | 2013222761 | A | 10/2013 |
| JP | 2013232580 | A | 11/2013 |
| JP | 5385247 | B2 | 1/2014 |
| JP | 2014009322 | A | 1/2014 |
| JP | 2014221915 | A | 11/2014 |
| JP | 2015010132 | A | 1/2015 |
| JP | 2015110752 | A | 6/2015 |
| JP | 2015214637 | A | 12/2015 |
| JP | 2016124967 | A | 7/2016 |
| JP | 2017512224 | A | 5/2017 |
| JP | 2017101137 | A | 6/2017 |
| JP | 2017520918 | A | 7/2017 |
| JP | 2017226724 | A | 12/2017 |
| JP | 2018519369 | A | 7/2018 |
| JP | 2018177993 | A | 11/2018 |
| JP | 2019167832 | A | 10/2019 |
| JP | 2019167833 | A | 10/2019 |
| JP | 2021107149 | A | 7/2021 |
| JP | 2021108319 | A | 7/2021 |
| TW | 201439219 | A | 10/2014 |
| WO | 2006104236 | A1 | 10/2006 |
| WO | 2008056810 | A1 | 5/2008 |
| WO | 2013051600 | A1 | 4/2013 |
| WO | 2014002918 | A1 | 1/2014 |
| WO | 2014136805 | A1 | 9/2014 |
| WO | 2015056483 | A1 | 4/2015 |
| WO | 2015126780 | A1 | 8/2015 |
| WO | 2015155949 | A1 | 10/2015 |
| WO | 2016038836 | A1 | 3/2016 |
| WO | 2016103654 | A1 | 6/2016 |
| WO | 2016136243 | A1 | 9/2016 |
| WO | 2017068762 | A1 | 4/2017 |
| WO | 2018028792 | A1 | 2/2018 |
| WO | 2018030286 | A1 | 2/2018 |
| WO | 2018030287 | A1 | 2/2018 |
| WO | 2018030288 | A1 | 2/2018 |
| WO | 2018084012 | A1 | 5/2018 |
| WO | 2018186161 | A1 | 10/2018 |
| WO | 2018235491 | A1 | 12/2018 |
| WO | 2018235492 | A1 | 12/2018 |
| WO | 2019059351 | A1 | 3/2019 |
| WO | 2019078140 | A1 | 4/2019 |
| WO | 2019088067 | A1 | 5/2019 |
| WO | 2019208756 | A1 | 10/2019 |
| WO | 2020090797 | A | 5/2020 |
| WO | 2020138055 | A1 | 7/2020 |
| WO | 2020138409 | A1 | 7/2020 |
| WO | 2020138410 | A1 | 7/2020 |
| WO | 2020166692 | A1 | 8/2020 |
| WO | 2020203304 | A1 | 10/2020 |
| WO | 2020203307 | A1 | 10/2020 |
| WO | 2021132710 | A1 | 7/2021 |
| WO | 2021200643 | A1 | 10/2021 |
| WO | 2022004463 | A1 | 1/2022 |
| WO | 2022138336 | A1 | 6/2022 |

OTHER PUBLICATIONS

Machine assisted English translation of JP2013221082A obtained from https://patents.google.com/patent on Oct. 27, 2021, 14 pages.
Machine assisted English translation of WO2020138410A1 obtained from https://patents.google.com/patent on Oct. 27, 2021, 19 pages.
Machine assisted English translation of WO2020138409A1 obtained from https://patents.google.com/patent on Oct. 27, 2021, 24 pages.
Machine assisted English translation of WO2018235492A1 obtained from https://patents.google.com/patent on Oct. 27, 2021, 21 pages.
Machine assisted English translation of JP11335572A obtained from https://patents.google.com/patent on Oct. 27, 2021, 7 pages.
Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google.com/patent on Oct. 27, 2021, 13 pages.
Machine assisted English translation of JP2000063681A obtained from https://patents.google.com/patent on Oct. 28, 2021, 8 pages.
Machine assisted English translation of CN103849149A obtained from https://worldwide.espacenet.com/patent on Jan. 22, 2024, 11 pages.
Machine assisted English translation of CN106715593A obtained from https://patents.google.com/patent on Mar. 14, 2023, 26 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.
Machine assisted English translation of JP2018177993A obtained from https://patents.google.com/patent on Mar. 15, 2023, 36 pages.
International Search Report for PCT/JP2019/051394 dated Mar. 17, 2020, 2 pages.
Machine assisted English translation of WO2018235492A1 obtained from https://patents.google.com/patent on Oct. 4, 2021, 20 pages.
Machine assisted English translation of JP2016124967A obtained

(56) References Cited

OTHER PUBLICATIONS from https://patents.google.com/patent on Oct. 4, 2021, 18 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.
Machine assisted English translation of JP2007231039A obtained from https://patents.google.com/patent on Oct. 5, 2021, 7 pages.
International Search Report for PCT/JP2019/051393 dated Mar. 17, 2020, 3 pages.
International Search Report for PCT/JP2019/051392 dated Mar. 17, 2020, 2 pages.
International Search Report for PCT/JP2019/051391 dated Mar. 13, 2020, 3 pages.
International Search Report for PCT/JP2020/012028 dated Jun. 9, 2020, 3 pages.
International Search Report for PCT/JP2020/012027 dated Jun. 9, 2020, 3 pages.
International Search Report for PCT/JP2020/012029 dated Jun. 9, 2020, 3 pages.
International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
International Search Report (with English translation) for PCT/JP2021/012840 dated Jun. 15, 2021, 6 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.
Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
Machine assisted English translation of JPH11158379A obtained from https://worldwide.espacenet.com/patent on Nov. 9, 2023, 11 pages.
English translation of International Search Report for PCT/JP2019/042320 dated Mar. 24, 2020, 2 pages.
Machine assisted English translation of JP2010047676A obtained from https://patents.google.com/patent on Jul. 21, 2021, 9 pages.
Machine assisted English translation of JP2015214637A obtained from https://patents.google.com/patent on Jul. 21, 2021, 11 pages.
Machine assisted English translation of JP2017101137A obtained from https://patents.google.com/patent on Jul. 21, 2021, 11 pages.
English translation of International Search Report for PCT/JP2021/046092 dated Feb. 8, 2022, 2 pages.
English translation of International Search Report for PCT/JP2021/046093 dated Mar. 15, 2022, 2 pages.
DOWSILTM EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.
Machine assisted English translation of JP2017226724A obtained from https://patents.google. com/patent on Aug. 14, 2024, 14 pages.
Machine assisted English translation of JP2003226812A obtained from https://patents.google.com/patent on Aug. 14, 2024, 11 pages.
Machine assisted English translation of JP2010047646A obtained from https://patents.google.com/patent on Aug. 14, 2024, 9 pages.
Machine assisted English translation of JPH10195085A obtained from https://patents.google.com/patent on Jan. 22, 2025, 10 pages.
Machine assisted English translation of JP2014221915A obtained from <https://patents.google.com/patent> on Nov. 20, 2024, 17 pages.

* cited by examiner

CURABLE SILICONE COMPOSITION, CURED PRODUCT OF SAME, AND METHOD FOR PRODUCING SAME

CROSS-REFERENCE TO RELATED APPLICATIONS

This application is the U.S. National Stage of International Application No. PCT/JP2020/012030 filed on 18 Mar. 2020, which claims priority to and all advantages of Japanese Application No. 2019-066557 filed on 29 Mar. 2019, the content of which is incorporated herein by reference.

TECHNICAL FIELD

The present invention relates to a curable silicone composition taking the form of granules, pellets, or sheets, and which can be obtained by a simple manufacturing method, has hot-melt properties, and adheres firmly even to difficult-to-adhere substrates. Further, the present invention relates to a cured product of the silicone composition, a method for molding the cured product, and a semiconductor device provided with the cured product.

BACKGROUND ART

Curable silicone compositions are utilized in a wide range of industrial fields because they are cured to form cured products having excellent heat resistance, cold resistance, electrical insulation, weather resistance, water repellency, and transparency. In general, the cured product of such a curable silicone composition is also suitable as an encapsulant for optical materials and semiconductor devices because such cured product is not readily discolored compared with other organic materials and there is less deterioration of physical properties.

The trend in the semiconductor device industry in recent years has been to use as a substrate nickel and gold, which are adhesion-poor materials, so there is a demand for a material, to be used to encapsulate devices, having superior heat resistance and a low coefficient of linear expansion as well as properties that enable the material to adhere firmly to these substrates. The present applicant has proposed in Patent Document 1 and Patent Document 2 a hot-melt curable silicone composition for molding which can yield a cured product that is relatively soft and has superior flexibility. However, because these compositions contain a large amount of functional inorganic fillers, they may not readily adhere to the adhesion-poor substrates such as gold and nickel, leaving room for improvement.

On the other hand, Patent Document 3 reports improvement in adhesion during low-temperature curing by adding a silatrane derivative to a silicone-based adhesive that does not have hot-melt properties. Moreover, although in the examples of Patent Document 4 there is disclosed an adhesive hot-melt silicone composition not containing a functional inorganic filler in which a silane-based adhesion promoter containing a silatrane derivative is added, there is no description nor suggestion regarding the superiority of the silatrane derivative when comparing the general silane compound with the silatrane derivative.

PRIOR ART DOCUMENTS

Patent Documents

Patent Document 1: International Publication WO 2018/030287 Pamphlet

Patent Document 2: International Publication WO 2018/030286 Pamphlet

Patent Document 3: Japanese Unexamined Patent Application Publication No. 2001-19933

Patent Document 4: Japanese Unexamined Patent Application Publication No. 2006-274007 (Japanese Patent No. 4849814)

SUMMARY OF THE INVENTION

Problems to be Solved by the Invention

An object of the present invention is to provide a curable silicone composition having hot-melt properties and which exhibits excellent melt properties, handling workability, and curing characteristics, as well as strongly adheres to an adhesion-poor material, even when containing a large amount of a functional inorganic filler. An additional object of the present invention is to provide a method for efficiently manufacturing such a curable silicone composition in the form of granules, pellets, or sheets. Furthermore, the present invention provides a semiconductor device member composed of such a curable silicone composition, a semiconductor device having the cured product, and a molding method of the cured product.

Means for Solving the Problems

As a result of diligent investigation, the present inventors have found that the above-mentioned problems can be solved by a curable silicone composition comprising:

(A1) an organopolysiloxane resin having no hot-melt properties as a whole molecule and wherein 20 mol % or more of the total siloxane units comprising the resin is siloxane units represented by $SiO_{4/2}$;

(A2) a straight or branched chain organopolysiloxane, liquid at 25° C., having at least two curing-reactive functional groups in the molecule, each such group containing a carbon-carbon double bond;

(B) one or more adhesion promoter selected from a silatrane derivative and a carbasilatrane derivative;

(C) a curing agent; and (D) a functional inorganic filler;

wherein the content of component (D) is 10% or more by volume relative to the entire composition, and the composition is solid at 25° C. and has hot-melt properties at a temperature of 200° C. or lower, leading to the present invention. Note that this curable silicone composition may be in the form of particles, pellets, or sheets.

When in the form of sheets, the cured silicone composition described above may be substantially flat, having a thickness of 10 to 1000 μm.

Moreover, the above-mentioned curable silicone composition can be used in a releasable laminate having the following configuration. That is, it may be in the form of a releasable laminate which has: a curable silicone composition sheet as described above; and a sheet-form substrate equipped with a release surface facing the curable silicone composition sheet, on one or both surfaces of the curable silicone composition sheet. Such a curable silicone composition sheet may be used as a film-form or sheet-form silicone adhesive.

The curable silicone composition of the present invention can be used in the form of a cured product and can be used as a member for a semiconductor device.

The curable silicone composition of the present invention and the cured product thereof can be used in semiconductor devices, and provided are a power semiconductor device, an optical semiconductor device, and a semiconductor device mounted on a flexible circuit base, in which an encapsulant, a light reflecting material and the like are formed by said cured product. In particular, the curable silicone composition of the present invention has superior gap-filling properties when melted, while the cured product thereof has superior flexibility and toughness at room temperature to high temperatures. Therefore, semiconductor devices in which semiconductor elements are encapsulated in a single package by so-called mold underfill or wafer molding, and post-encapsulation semiconductor element substrates in which semiconductor elements are encapsulated by the cured product on a flexible circuit board where deformation (bending, etc.) is presupposed as a manner of use, are suitably provided with the use of curable silicone composition of the present invention.

The method of molding the curable silicone composition of the present invention comprises at least the following steps:

(I) a step of heating the above-described curable silicone composition in the form of pellets or sheets to a temperature of 100° C. or higher to melt;

(II) a step of injecting the curable silicone composition obtained in step (I) into a mold, or a step of distributing the curable silicone composition obtained in step (I) into a mold by clamping; and (III) a step of curing the curable silicone composition injected in step (II).

Note that the molding method described above includes transfer molding, compression molding, or injection molding, and the curable silicone composition of the present invention is suitably used as a material for the molding thereof. Furthermore, the curable silicone composition of the present invention is suitable for the so-called mold underfill method, which is a coating process in which overmolding and underfilling of a semiconductor device by the cured product are simultaneously performed, or for the wafer-molding process, which is an overmolding process covering the surface of a semiconductor wafer substrate equipped with semiconductor elements as well as filling the gaps between such semiconductor elements that allows a relatively large wafer, for example, 8 inches or 12 inches to be sealed all at once.

In particular, the curable silicone composition of the present invention, especially the curable silicone composition in a pellet or sheet form, can be used for large-area encapsulation of semiconductor substrates (including wafers). Furthermore, a sheet formed from the curable silicone composition of the present invention can be used for die attach films, for sealing a flexible device, for stress relief layers for bonding two different substrates, and the like.

Similarly, the present inventors provide a method for manufacturing a curable silicone composition sheet, comprising the following steps:

Step 1: a step of mixing raw material components of the above-described curable silicone composition at a temperature of 50° C. or higher;

Step 2: a step of kneading the mixture obtained by step 1 while heat-melting;

Step 3: a step of laminating the heat-melted mixture obtained by step 2 between two films, each film equipped with at least one release surface; and Step 4: a step of extending the laminate obtained by step 3 between rollers to form a curable silicone sheet having a specific film thickness.

Effects of the Invention

The curable silicone composition according to the present invention has hot-melt properties, excellent handling workability and curing properties, as well as being capable of forming cured products that adhere firmly to even difficult-to-adhere substrates. In addition, such curable silicone composition can be produced using only simple mixing processes and can be efficiently manufactured. In addition, the cured product of the present invention is useful as a member of a semiconductor device, and by using the molding method of the present invention, these cured products can be efficiently manufactured in accordance with applications.

DETAILED DESCRIPTION OF THE INVENTION

[Curable Silicone Composition] The curable silicone composition of the present invention comprises:

(A1) an organopolysiloxane resin having no hot-melt properties as a whole molecule, wherein 20 mol % or more of the total siloxane units of the resin is siloxane units represented by $SiO_{4/2}$; (A2) a straight or branched chain organopolysiloxane that is liquid at 25° C. and having at least two curing-reactive functional groups in the molecule, each such group containing a carbon-carbon double bond;

(B) one or more adhesion promoters selected from a silatrane derivative and carbasilatrane derivative;

(C) a curing agent; and (D) a functional inorganic filler; and the composition is solid at 25° C. and has hot-melt properties at a temperature of 200° C. or lower. In the present invention, unless otherwise stated, "having hot-melt properties" means having a softening point of 50° C. or higher, and, at 150° C., having melt viscosity (suitably, a melt viscosity of less than 1,000 Pa-s), and having flowing properties. Meanwhile, if the softening point is 200° C. or higher, it is defined as "not having hot-melt properties" because such temperature is generally above the operating temperature for molding applications.

Hereinafter, each component and optional component of the composition will be described. In the present invention, unless otherwise defined, the term "average particle diameter" means the average particle diameter of the primary particles.

Component (A) is a basic material of the present composition and is a component for providing hot-melt properties to the present composition. Moreover, because it has a curable group containing a carbon-carbon double bond, it is cured by a curing agent that is component (C). Exemplary curing reactions include a hydrosilylation reaction and a radical reaction.

Examples of the hydrosilylation reactive group in component (A) include an alkenyl group having 2 to 20 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, and a silicon atom-bonded hydrogen atom. As the hydrosilylation reactive group, an alkenyl group is preferable. The alkenyl group may be linear or branched and is preferably a vinyl group or a hexenyl group. Component (A) preferably has at least two hydrosilylation reactive groups in one molecule.

Examples of the group bonded to a silicon atom other than the hydrosilylation reactive group in component (A) (herein designated as "R") include an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, and a hydroxyl group. Specific examples thereof include: alkyl groups such as methyl groups, ethyl groups, propyl groups, butyl groups, pentyl groups, hexyl groups, heptyl groups, octyl groups, nonyl groups, decyl groups, undecyl groups, or dodecyl groups; aryl groups such as phenyl groups, tolyl groups, xylyl groups, naphthyl groups, anthracenyl groups, phenanthryl groups, or pyrenyl groups; aralkyl groups such as phenethyl groups or phenylpropyl groups; groups in which a part or all of the hydrogen atoms bonded to these groups are substituted with a halogen atom such as a chlorine atom or a bromine atom; and alkoxy groups such as methoxy groups, ethoxy groups, or propoxy groups.

Examples of radical reactive groups in component (A) include: alkyl groups having 1 to 20 carbon atoms, such as methyl groups, ethyl groups, propyl groups, butyl groups, pentyl groups, hexyl groups, heptyl groups, octyl groups, nonyl groups, decyl groups, undecyl groups, or dodecyl groups; alkenyl groups having 2 to 20 carbon atoms, such as vinyl groups, allyl groups, butenyl groups, pentenyl groups, hexenyl groups, heptenyl groups, octenyl groups, nonenyl groups, decenyl groups, undecenyl groups, or dodecenyl groups; acryl-containing groups such as 3-acryloxypropyl groups or 4-acryloxybutyl groups; methacryl-containing groups such as 3-methacryloxypropyl groups or 4-methacryloxybutyl groups; and a silicon atom-bonded hydrogen atom. As the radical reactive group, an alkenyl group is preferable. The alkenyl group may be linear or branched, and is preferably a vinyl group or a hexenyl group. Component (A) preferably has at least two radical reactive groups in one molecule.

Examples of the group bonded to a silicon atom other than the radical reactive group in component (A) include a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, and a hydroxyl group, with the same groups as those described above exemplified. In particular, a methyl group and a hydroxyl group are preferable.

In the present invention, component (A) must be a mixture of component (A1), an organopolysiloxane resin wherein 20 mol % or more of the total siloxane units of the resin is siloxane units represented by $SiO_{4/2}$, and component (A2), a straight or branched chain organopolysiloxane. This is because the hot-melt property is not expressed when each component is used by itself without being a mixture.

In other words, component (A) is concretely (A1) an organopolysiloxane resin having no hot-melt properties as a whole molecule and wherein 20 mol % or more of the total siloxane units comprising the resin is siloxane units represented by $SiO_{4/2}$, and (A2) a mixture of a straight or branched chain organopolysiloxane, liquid at 25° C., having at least two curing-reactive functional groups in the molecule, each such group containing a carbon-carbon double bond. These components are described hereinafter.

[Component (A1)]

Component (A1) is one of the basic materials of the present composition used together with component (A2), and is an organopolysiloxane resin not having hot-melt properties by itself and wherein 20 mol % or more of the total siloxane units in the organopolysiloxane resin are siloxane units represented by $SiO_{4/2}$, or an organopolysiloxane resin mixture containing the same.

Component (A1) is an organopolysiloxane resin that does not have hot-melt properties as a whole molecule and is solid in a solvent-free state. Here, "not having a hot-melt property" means that the resin, which is component (A1), alone on its own, does not exhibit heat-melting behavior at a temperature of 200° C. or lower, and specifically means that the component does not have a softening point and melt viscosity. For component (A1), such properties are not restricted to particular structures, but the functional group in the organopolysiloxane resin is preferred to be a monovalent hydrocarbon group having 1 to 10 carbon atoms, in particular, a functional group selected from an alkenyl group or an alkyl group having 1 to 10 carbon atoms such as a methyl group and be substantially free of aryl groups such as a phenyl group. If the component contains a large amount of phenyl groups and the like, the component may become hot-meltable. In addition, resistance of the cured product to coloration under heating and aging (at high temperatures), as described below, may be reduced. Suitably, the functional group bonded to the silicon atom in component (A1) is a group selected from a methyl group and an alkenyl group such as a vinyl group, and it is preferable that 70 to 100 mol % of the functional group bonded to all silicon atoms is a methyl group, and it is more preferable that 80 to 100 mol % of the functional group bonded to all silicon atoms is a methyl group, and it is particularly preferable that 88 to 100 mol % of the functional group bonded to all silicon atoms is a methyl group and that all other functional groups bonded to silicon atoms is an alkenyl group such as a vinyl group. In such a range, component (A1) is not hot-meltable, and can be designed as a component the cured product of which is particularly superior in coloration resistance and the like, at high temperatures. A small amount of a hydroxyl group or an alkoxy group may be included in said component (A1).

Component (A1) is an organopolysiloxane resin that is solid in a solvent-free state, and is characterized as having 20 mol % or more of the total siloxane units in the organopolysiloxane resin molecule to be siloxane units represented by $SiO_{4/2}$. These branching siloxane units are preferably at least 40 mol % of the total siloxane units, and in particular, in the range of 40 to 90 mol %. R is a monovalent organic group, suitably a functional group selected from a monovalent hydrocarbon group having 1 to 10 carbon atoms, particularly an alkyl group having 1 to 10 carbon atoms such as a methyl group or an alkenyl group, and from the viewpoint of technical effectiveness, R preferably does not substantially contain an aryl group such as a phenyl group. Optionally, volatile components generated in the production process thereof may be removed. The degree of said removal is defined the same as the rate of mass loss when the resin is exposed to 200° C. for 1 hour as described above, and volatile low molecular weight components are preferably removed from the organopolysiloxane resin so that the rate of mass loss is 2.0 mass % or less.

It is not required for component (A1) to contain a reactive functional group containing a carbon-carbon double bond group, in which case the reactive functional group of component (A) will be supplied from component (A2) described below. When the content of the functional inorganic filler, which is component (D) described below, is high, the elastic modulus of the resulting cured product tends to be high, and therefore, it is better if (A1) does not contain a carbon-carbon double bond group; conversely, when the content of component (D) is small, component (A1) preferably includes a carbon-carbon double bond for the elastic modulus of the obtained cured product to achieve a suitable value. In other words, for component (A1), the amount of the carbon-carbon double bond group is preferably controlled as appropriate by combining the following component (A1-1) and component (A1-2).

[Component (A1-1)]

Component (A1-1) of the present invention is a non-hot-meltable organopolysiloxane resin which does not have a curing reactive functional group containing a carbon-carbon double bond in the molecule.

Component (A1-1) is an organopolysiloxane resin wherein 20 mol % or more of the total siloxane units in the organopolysiloxane resin are siloxane units represented by $SiO_{4/2}$, does not have hot-melt properties as a whole molecule, and does not have a curing reactive functional group containing a carbon-carbon double bond in the molecule. By using this component as all or a part of component (A1) in combination with a straight or branched chain organopolysiloxane that is component (A2) within a predetermined quantitative range, the hot-melt properties of the entire composition are realized.

Component (A1-1) is an organopolysiloxane resin that does not have hot-melt properties as a whole molecule and is solid in a solvent-free state. Here, the absence of hot-melt properties means that the resin, which is component (A1-1), does not exhibit heating and melting behavior, and specifically means that the resin does not have a softening point or melt viscosity at a temperature of 200° C. or lower alone, as already explained for component (A1).

The functional group bonded to the silicon atom in component (A1-1) is suitably a methyl group, and it is preferable that 70 mol % or more of all the functional group bonded to all the silicon atoms is a methyl group, more preferable that 80 mol % or more is a methyl group, and in particular preferably 88 mol % or more is a methyl group. In such a range, component (A1-1) is not hot-meltable, and can be designed as a component the cured product of which is particularly superior in coloration resistance and the like at high temperatures. A small amount of a hydroxyl group or an alkoxy group may be included in said component (A1-1).

Since component (A1-1) does not have a curing-reactive group having a carbon-carbon double bond in the molecule, the component does not form a cured product alone. However, the component has a reinforcing effect on the cured product, improves the hot-melt properties of the composition as a whole, and can be used as a part of component (A) that has curability.

Component (A1-1) is an organopolysiloxane resin that is solid in a solvent-free state, wherein 20 mol % or more of the total siloxane units in the organopolysiloxane resin molecule are branching siloxane units represented by $SiO_{4/2}$. Suitably, these branching siloxane units are 30 mol %, preferably 40 mol % or more, and particularly preferably in the range of 40 to 65 mol % of the total siloxane units.

Suitably, component (A1-1) is an organopolysiloxane resin having no hot-melt properties, represented by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

(In the formula, each $R^1$ independently has from 1 to 10 carbon atoms and is a monovalent hydrocarbon group that does not contain carbon-carbon double bonds; each $R^2$ is a hydrogen atom or an alkyl group having 1 to 10 carbon atoms; and a, b, c, d, and e are numbers satisfying the following: $0.10 \le a \le 0.60$, $0 \le b \le 0.70$, $0 \le c \le 0.80$, $0.20 \le d \le 0.65$, $0 \le e \le 0.05$, and $a+b+c+d=1$).

In the above average unit formula, each $R^1$ independently is a monovalent hydrocarbon group that has from 1 to 10 carbon atoms and does not contain any carbon-carbon double bonds, such as methyl, ethyl, propyl, butyl, pentyl, hexyl, heptyl, or similar alkyl group; aryl group such as phenyl, tolyl, xylyl, or similar; aralkyl group such as benzyl, phenethyl, or similar; and alkyl halide group such as chloromethyl, 3-chloropropyl, 3,3,3-trifluoropropyl, or similar. Herein, from the viewpoint of industrial production and the technical effect of the invention, it is preferable that 70 mol % or more of all $R^1$ in one molecule are an alkyl group having 1 to 10 carbon atoms, such as a methyl group, and particularly preferable that 88 mol % or more are a methyl group. On the other hand, $R^1$ is preferably substantially free of an aryl group, such as a phenyl group. If a large amount of aryl groups such as phenyl groups is contained, component (A1-1) itself may become hot-meltable and the technical effect of the present invention may not be achieved, and the coloration resistance of the cured product at high temperatures may deteriorate.

In the formula, $R^2$ is a hydrogen atom or an alkyl group having 1 to 10 carbon atoms. Examples of the alkyl group for $R^2$ include methyl, ethyl, propyl, butyl, pentyl or hexyl. The relevant functional group $R^2O_{1/2}$ containing $R^2$ corresponds to the hydroxyl group or alkoxy group in component (A2-1-1).

In the formula, "a" is a number indicating the percentage of siloxane units of the general formula: $R^1{}_3SiO_{1/2}$. This number satisfies $0.1 \le a \le 0.60$, preferably $0.15 \le a \le 0.55$. With a being at or above the lower limit of the aforementioned range, then the composition containing the component, the composition as a whole, can achieve favorable hot-melt performance. On the other hand, with "a" being less than or equal to the upper limit of the aforementioned range, the mechanical strength (hardness and the like) of the cured product obtained is not too low.

In the formula, "b" is a number indicating the percentage of siloxane units of the general formula: $R^1{}_2SiO_{2/2}$. This number satisfies $0 \le b \le 0.70$, preferably $0 \le b \le 0.60$. With "b" being less than or equal to the upper limit of the range, the composition containing the component can achieve favorable hot-melt performance as an entire composition and a composition with a low level of stickiness at room temperature can be obtained. In the present invention, "b" may be and is preferred to be 0.

In the formula, "c" is a number indicating the percentage of siloxane units of the general formula: $R^1SiO_{3/2}$. This number is given by $0 \le c \le 0.70$ and preferably satisfies $0 \le c \le 0.60$. With "c" being less than or equal to the upper limit of the range, the composition containing the component can achieve favorable hot-melt performance as an entire composition and a composition with a low level of stickiness at room temperature can be obtained. In the present invention, "c" may be and is preferred to be 0.

In the formula, "d" is a number indicating the percentage of $SiO_{4/2}$ siloxane units and is necessarily $0.20 \le d \le 0.65$, preferably is $0.40 \le d \le 0.65$, and particularly preferably is $0.50 \le d \le 0.65$. Within this numerical range, the composition containing this component can achieve favorable hot-melt performance as a whole, superior mechanical strength of the resulting cured product, and favorable handleability without stickiness as an entire composition.

In the formula, "e" is a number indicating the relative molar amount of the general formula: $R^2O_{1/2}$, where the units are a hydroxyl group or alkoxy group bonded to a silicone atom that can be contained in the organopolysiloxane resin. This number satisfies 0≤e≤0.05, preferably 0≤e≤0.03. With e being below the upper limit of the range, a material that achieves favorable hot-melt performance as a whole composition can be obtained. Note that the sum of a, b, c and d, which is the sum of the percentage of each of the siloxane units, is equal to 1.

Component (A1-1) is an organopolysiloxane resin having the characteristics described above, and can be microparticles to improve handleability. Specifically, organopolysiloxane resin microparticles having true spherical shape with an average primary particle diameter of 1 to 20 μm, as measured using a laser diffraction/scattering method or the like, is preferred. The use of this type of microparticle component improves handleability when the composition is produced as a granular, pellet, or sheet form. When obtaining the microparticulate component (A1-1), a mixture with the curing reactive component (A1-2) described below may be particulated, and component (C) described below, for example, a hydrosilylation reaction catalyst, may also be particulated together with component (A1-1) and is preferred.

An example of a method of particulating the organopolysiloxane resin described above is a method of pulverizing the organopolysiloxane using a pulverizer or a method of directly particulating the organopolysiloxane in the presence of a solvent. The pulverizer may be, for example, but is not limited to, a roll mill, a ball mill, a jet mill, a turbo mill, or a planetary mill. As a method of directly microparticulating the silicone in the presence of a solvent, for example, spraying by a spray dryer, or microparticulating by a biaxial kneader or a belt dryer can be cited. In the present invention, the use of spherical hot-meltable organopolysiloxane resin microparticles obtained by spraying with a spray dryer is particularly preferable in terms of t handleability at room temperature and efficiency during manufacture and handling workability of the composition.

By using a spray dryer or the like, component (A1-1), having a true spherical shape and an average primary particle size of 1 to 500 μm can be manufactured. The heating and drying temperature of the spray dryer needs to be appropriately set based on the heat resistance and the like of the organopolysiloxane resin microparticles. In order to prevent secondary aggregation of the organopolysiloxane resin microparticles, the temperature of the organopolysiloxane resin microparticles is preferably controlled below the glass transition temperature thereof. The organopolysiloxane resin microparticles thus obtained can be recovered by a cyclone, a bag filter, or the like.

In order to obtain a uniform component (A1-1), a solvent may be used in the above-mentioned step within a range that does not inhibit the curing reaction. Exemplary solvents include, but are not limited to: aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyltrisiloxane, and decamethyltetrasiloxane; esters such as ethyl acetate, butyl acetate, and propylene glycol monomethyl ether; and ketones such as acetone, methyl ethyl ketone, and methyl isobutyl ketone.

[Component (A1-2)]

Suitably, component (A1-2) is an organopolysiloxane resin not having hot-melt properties represented by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

(in the formula, each $R^1$ is an independent monovalent hydrocarbon group having 1 to 10 carbon atoms, however, 1 to 12 mol % of all $R^1$ in a molecule is an alkenyl group; each $R^2$ is a hydrogen atom or an alkyl group having 1 to 10 carbon atoms; and a, b, c, d, and e are numbers satisfying the following: 0.10≤a≤0.60, 0≤b≤0.70, 0≤c≤0.80, 0≤d≤0.65, 0≤e≤0.05, wherein c+d>0.20, and a+b+c+d=1).

In the average unit formula above, each $R^1$ is independently a monovalent hydrocarbon group having 1 to 10 carbon atoms, which are: alkyl group such as methyl, ethyl, propyl, butyl, pentyl, hexyl, heptyl, or similar; alkenyl group such as vinyl, allyl, butenyl, pentenyl, hexenyl, or similar; aryl group such as phenyl, tolyl, xylyl, or similar; aralkyl group such as benzyl, phenethyl, or similar; and alkyl halide group chloromethyl, 3-chloropropyl, 3,3,3-trifluoropropyl, or similar. Furthermore, 1 to 12 mol % of all $R^1$ in one molecule is an alkenyl group, and preferably 2 to 10 mol % of all $R^1$ in one molecule is an alkenyl group. If the alkenyl group content is less than the lower limit of the range described above, the mechanical strength (hardness and the like) of the resulting cured product may be insufficient. On the other hand, with the content of the alkenyl group being below the upper limit of the range described above, the composition containing this component can achieve favorable hot-melt performance as an entire composition. Each $R^1$ is preferably a functional group selected from an alkyl group having 1 to 10 carbon atoms such as a methyl group and an alkenyl group such as a vinyl group or a hexenyl group, and from the viewpoint of the technical effect of the invention, the $R^1$ preferably does not substantially contain an aryl group such as a phenyl group. If a large amount of aryl groups such as phenyl groups are contained, component (A1-2) itself may become hot-meltable and the technical effect of the present invention may not be achieved, and in the cured product, the effect of reinforcing the cured product peculiar to $SiO_{4/2}$ groups may be reduced.

In the formula, $R^2$ is a hydrogen atom or an alkyl group having 1 to 10 carbon atoms. Examples of the alkyl group for $R^2$ include methyl, ethyl, propyl, butyl, pentyl or hexyl. The relevant functional group $R^2O_{1/2}$ containing $R^2$ corresponds to the hydroxyl group or alkoxy group in component (A1-2).

In the formula, "a" is a number indicating the percentage of siloxane units of the general formula: $R^1{}_3SiO_{1/2}$. This number satisfies 0.1≤a≤0.60, preferably 0.15≤a≤0.55. With "a" being at or above the lower limit of the aforementioned range, the composition containing the component, the composition as a whole, can achieve favorable hot-melt performance. On the other hand, With "a" being less than or equal to the upper limit of the aforementioned range, the mechanical strength (hardness, elongation rate, and the like) of the cured product obtained is not too low.

In the formula, "b" is a number indicating the percentage of siloxane units of the general formula: $R^1{}_2SiO_{2/2}$. This number satisfies 0≤b≤0.70, preferably 0≤b≤0.60. With "b" being less than or equal to the upper limit of the range, the composition containing the component can achieve favorable hot-melt performance as an entire composition and a composition with a low level of stickiness at room temperature can be obtained.

In the formula, "c" is a number indicating the percentage of siloxane units of the general formula: $R^3SiO_{3/2}$. This number is given by 0≤c≤0.80 and preferably satisfies $0 \leq c \leq 0.75$. With "c" being less than or equal to the upper limit of the range, the composition containing the component can achieve favorable hot-melt performance as a whole composition and a tack-free composition with a low level of stickiness at room temperature can be obtained. In the present invention, c may be and is preferred to be 0.

In the formula, "d" is a number indicating the percentage of $SiO_{4/2}$ siloxane units and is necessarily $0.00 \leq d \leq 0.65$, preferably is $0.20 \leq d \leq 0.65$, and particularly preferably is $0.25 \leq d \leq 0.65$. This is because within the above numerical range, the composition containing the component can achieve favorable hot-melt performance as a whole composition, and the resulting cured product has sufficient flexibility.

In the present invention, c or d may be 0, but it is necessary that $c+d>0.20$. If the value of c+d is less than the lower limit described above, favorable hot-melt performance cannot be achieved for the composition as a whole, and the technical effect of the present invention may not be sufficiently achieved.

In the formula, "e" is a number indicating the relative molar amount of the general formula: $R^2O_{1/2}$, where the units are a hydroxyl group or alkoxy group bonded to a silicone atom that can be contained in the organopolysiloxane resin. This number satisfies $0 \leq e \leq 0.05$, preferably $0 \leq e \leq 0.03$. With "e" being below the upper limit of the range, a material that achieves favorable hot-melt performance as a whole composition can be obtained. Note that, the sum of a, b, c and d, which is the sum of each siloxane unit, is equal to 1.

Component (A1-2) is an organopolysiloxane resin having the characteristics described above, and similar to component (A1-1), may be particulated to improve handleability. Specifically, organopolysiloxane resin microparticles having true spherical shape with an average primary particle diameter of 1 to 20 μm measured using a laser diffraction/scattering method or the like are preferable, and the use of these microparticle components improves the handling workability when the composition is produced in a granular, pellet, or sheet form. When obtaining the microparticulate component (A1-2), a mixture with the curing reactive component (A1-1) described above may be particulated, and component (C) described below, for example, a hydrosilylation reaction catalyst, may also be particulated together with component (A1-2) and is preferred. The method of particulation is the same as for component (A1-1).

As noted above, the quantitative ratio of component (A1-1) and component (A1-2) depends on the amount of the component (D) described below. A suitable mass ratio of component (A1-1) to component (A1-2) may be in the range of 100:0 to 25:75, preferably in the range of 100:0 to 60:40, and more preferably in the range of 100:0 to 55:45. Component (A1-1) is not itself curable, but by adding a small amount of component (A1-2) and using in combination with the component (A1-2) in this composition, the elastic modulus of the cured product produced from this composition at high temperatures can be controlled. When the functional inorganic filler described below is added to the composition, by suitably adjusting the amount of the filler and the amount of component (A1-2) used, an appropriate elastic modulus and flexibility can be achieved. For example, when the amount of functional inorganic filler added is large or when reducing the elastic modulus of the cured product obtained to the extent possible is desired, the composition can be blended with only the component (A1-1) without adding component (A1-2).

[Removal of Volatile Low Molecular Weight Components in Component (A1)]

In the production process of component (A1-1) and component (A1-2), volatile low molecular weight components are generated. Specifically, these have a structure of $M_4Q$ and appear as a byproduct when polymerizing an organopolysiloxane resin made up of an M unit ($R^3{}_3SiO_{1/2}$) and a Q unit ($SiO_{4/2}$). The components with this structure have the effect of significantly reducing the hardness of the cured product that makes up the composition of the present invention. The organopolysiloxane resin used herein is polymerized in the presence of a highly co-soluble organic solvent, and the organic solvent is removed by drying under reduced pressure or the like, to obtain a solid organopolysiloxane resin. However, the $M_4Q$-structured components have high mutual solubility with the organopolysiloxane resin, and cannot be removed by drying conditions that remove the organic solvent. It is known that the structure can be removed by exposure to a temperature of 200° C. or higher for a short period of time. However, if these components are removed by exposure to a high temperature after integral molding with a substrate of a semiconductor and such, the volume of the cured product decreases and the hardness of the cured product increases remarkably, causing the dimensions of the molded material to change and warping to occur. Therefore, the $M_4Q$-structured components must be removed before the molding process with the substrate, in other words, while a raw material, in order to apply to an application of the present invention.

Examples of methods for removing the structure include a method of removing together with the aforementioned organic solvent using a biaxial kneader and a method of providing a particulate organopolysiloxane based on the method described below and then removing through drying in an oven or the like.

More specifically, component (A1-1) and component (A1-2) are produced in the presence of organic solvents, and volatile components appear as byproducts during synthesis. Since the volatile components can be removed by briefly treating the obtained organopolysiloxane resin that is still a coarse raw material at a high temperature of roughly 200 degrees, the organic solvent and volatile components can simultaneously be removed from component (A1-1) and component (A1-2) using a biaxial mixer set at roughly 200° C. When component (A1-1) and component (A1-2) are handled as spherical powders, the components can be converted into powder by removing the organic solvent with a spray dryer, but the volatile components can not be removed using this method. If the resulting powder is treated at a low temperature of about 120° C. for 24 hours, the volatile components can be removed without agglomeration of the powder.

[Component (A2)]

Component (A2) is one of the basic materials of the present composition used together with component (A1), and is a straight- or branched-chain organopolysiloxane that is liquid at 25° C. and has at least two curing reactive functional groups in the molecule, each such group containing a carbon-carbon double bond. Such curing-reactive chain-form organopolysiloxane, when mixed with the aforementioned solid organopolysiloxane resin (A1), expresses hot-melt properties as an entire composition.

Component (A2) must have a curing reactive group having a carbon-carbon double bond in the molecule, and if component (A1) does not have a carbon-carbon double bond, the curing reactive group of component (A) is supplied from component (A2). The carbon-carbon double bond is a hydrosilylation reactive, radical reactive, or organic peroxide curable functional group that forms a cured product based on cross-linking reactions with other components. Such curing reactive group is an alkenyl group or an acrylic group, and examples of such groups are the same as described above, and a vinyl group or a hexenyl group are in particular preferable.

Component (A2) is a straight- or branched-chain organopolysiloxane in a liquid state at 25° C. (room temperature), and when mixed with component (A1) in a solid state at room temperature, the composition as a whole exhibits hot-melt-ability. The structure thereof may be a branched-chain organopolysiloxane having a small number of branching siloxane units (for example, T units represented by the general formula: $R^4SiO_{3/2}$ ($R^4$ represents independent monovalent hydrocarbon groups having 1 to 10 carbon atoms) or Q units represented by $SiO_{4/2}$), and is suitably a straight-chain organopolysiloxane (A2-1) expressed by the following structural formula: $R^4_3SiO(SiR^4_2O)_kSiR^4_3$ (In the formula, each $R^4$ is independently a monovalent hydrocarbon group having 1 to 10 carbon atoms, except that at least two of the $R^4$ in one molecule is an alkenyl group, and k is a number from 20 to 5,000). Suitably, a straight-chain diorganopolysiloxane having one alkenyl group each at both ends of the molecular chain is preferred.

In the formula, each $R^4$ is independently a monovalent hydrocarbon group having 1 to 10 carbon atoms, being alkyl group such as methyl, ethyl, propyl, butyl, pentyl, hexyl, heptyl, or similar; alkenyl group such as vinyl, allyl, butenyl, pentenyl, hexenyl, or similar; aryl group such as phenyl, tolyl, xylyl, or similar; aralkyl group such as benzyl, phenethyl, or similar; and alkyl halide group such as chloromethyl, 3-chloropropyl, 3,3,3-trifluoropropyl, or similar. Furthermore, at least two of the $R^4$ in one molecule are alkenyl groups, preferably a vinyl group. Each $R^4$ is also preferably a functional group selected from an alkyl group having 1 to 10 carbon atoms such as a methyl group or an alkenyl group such as a vinyl group or a hexenyl group, and it is particularly preferable that of all $R^4$, at least two are alkenyl groups, and the remaining $R^4$ are methyl groups. Note, from the viewpoint of the technical effect of the invention, the $R^4$ is preferably substantially free of an aryl group such as a phenyl group. If a large amount of aryl groups such as phenyl groups are contained therein, the coloration resistance of the cured product at high temperatures may deteriorate. Particularly suitable is a structure having an alkenyl group such as a vinyl group at both molecular terminals, and the rest of the $R^4$ being methyl groups.

In the formula, k is a number between 20 and 5,000, preferably between 30 and 3,000, and particularly preferably between 45 and 800. With k being at or above the lower limit of the aforementioned range, a granular composition having a low level of stickiness at room temperature can be obtained. On the other hand, with k being below the upper limit of the aforementioned range, the composition as a whole can achieve favorable hot-melt performance.

[Mixture Containing Non-Hot-Melt Organopolysiloxane Resin]

When components (A1-1), (A1-2), and (A2-1) described above are used to comprise component (A) of the present invention, for 100 mass parts (total sum) of component (A1) organopolysiloxane resin comprising (A1-1) and (A1-2) in a mass ratio of 100:0 to 25:75, the amount of component (A2-1) used is preferably in the range of 10 to 200 mass parts. Here, the carbon-carbon double bond, which is a curing reactive group, is supplied from component (A1-2) and component (A2-2), and the amount of the functional group needs to be controlled appropriately based on the type and amount of component (D) described below. In particular, when the amount of component (D) added to the composition is 30 volume % or more, the composition will preferably contain 0.05 to 1.50 mol % of carbon-carbon double bonds per 100 g of silicone component in the composition. Below the lower limit, the curability and curing speed may be reduced. If above the upper limit, the cured product may be remarkably brittle, in particular if a large amount of functional filler is blended into the composition.

The combination of component (A1-1, -2) and component (A2) is not restricted, but can be adjusted as appropriate depending on the type and amount of component (D) added as described below. When a large amount of component (D) is added, it is preferable to use a relatively low molecular weight material as one of component (A1-1, 2) or component (A2) for increasing the melting properties of the obtained composition, but if a low molecular weight component (A2) is used, flexibility and toughness of the obtained cured product tends to decrease regardless of the type of component (A1). For this reason, a low molecular weight (A1-1, -2) is preferably combined with a high molecular weight component (A2). On the other hand, if the amount of component (D) added is small, the surface stickiness of the obtained composition can be suppressed by combining a high molecular weight component (A1-1, -2) and a high molecular weight component (A2).

Component (B) is an adhesion promoter that is the feature of the present invention, and is one or more components selected from silatrane derivatives and carbasilatrane derivatives. In this composition, these components can dramatically improve curing adhesion, in particular to difficult-to-adhere substrates.

Silatran derivatives are disclosed in the patent document 3 described above (Japanese Patent Publication No. 2001-019933), represented by the following structural formula (1):

[Formula 1]

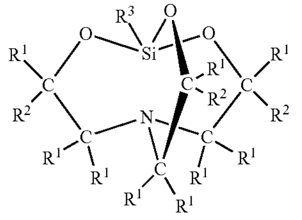

In Formula (1), R1 is the same or different hydrogen atom or alkyl group, and R2 is the same or different group selected from: a hydrogen atom, an alkyl group, and an alkoxysilyl group-containing organic group represented by the general formula: —R4-Si(OR5)xR6(3-x)

(in the formula, R4 is a divalent organic group, R5 is an alkyl group having 1 to 10 carbon atoms, R6 is a substituted or unsubstituted monovalent hydrocarbon group, and x is 1, 2, or 3, provided that at least one R2 is this alkoxysilyl group-containing organic group, and R3 is a group selected from a substituted or unsubstituted monovalent hydrocarbon group, an alkoxy group having 1 to 10 carbon atoms, a glycidoxyalkyl group, an oxiranylalkyl group, an acyloxyalkyl group, or an alkenyl group;

In Formula 1, $R^1$ is the same or different hydrogen atom or alkyl group, with $R^1$ particularly preferably being a hydrogen atom or a methyl group. Moreover, $R^2$ in the above formula is the same or different group selected from the group consisting of: a hydrogen atom, an alkyl group, and an alkoxysilyl group-containing organic group represented by a general formula:

$$-R^4-Si(OR^5)_xR^6_{(3-x)},$$

provided that at least one $R^2$ is an alkoxysilyl group-containing organic group of the general formula. Exemplary alkyl groups of $R^2$ include methyl groups. Moreover, in the alkoxysilyl group-containing organic group of $R^2$, $R^4$ in the formula is a divalent organic group, with examples thereof including an alkylene group or an alkylene oxyalkylene group, wherein an ethylene group, a propylene group, a butylene group, a methylene oxypropylene group, or a methylene oxypentylene group is preferable. Moreover, $R^5$ in the formula is an alkyl group having 1 to 10 carbon atoms, and is preferably a methyl group or an ethyl group. Moreover, $R^6$ in the formula is a substituted or unsubstituted monovalent hydrocarbon group, preferably a methyl group. Moreover, in the formula, x is 1, 2, or 3, and preferably 3.

Exemplary alkoxysilyl group-containing organic groups of $R^2$ include the following groups:

$$-(CH_2)_2Si(OCH_3)_3-(CH_2)_2Si(OCH_3)_2CH_3$$

-continued $$-(CH_2)_3Si(OCH_2H_5)_3\text{-}(CH_2)_3Si(OC_2H_5)(CH_3)_2$$

$$-CH_2O(CH_2)_3Si(OCH_3)_3$$

$$-CH_2O(CH_2)_3Si(OC_2H_5)_3$$

$$-CH_2O(CH_2)_3Si(OCH_3)_2CH_3$$

$$-CH_2O(CH_2)_3Si(OC_2H_5)_2CH_3$$

$$-CH_2OCH_2Si(OCH_3)_3-CH_2OCH_2Si(OCH_3)(CH_3)_2$$

$R^3$ in the above formula 1 is at least one group selected from the group consisting of a substituted or unsubstituted monovalent hydrocarbon group, an alkoxy group having 1 to 10 carbon atoms, a glycidoxyalkyl group, an oxiranylalkyl group, and an acyloxyalkyl group, with exemplary monovalent hydrocarbon groups of $R^3$ including alkyl groups such as methyl groups, exemplary alkoxy groups of $R^3$ including methoxy groups, ethoxy groups, and propoxy groups, exemplary glycidoxypropyl groups of $R^3$ including 3-glycidoxypropyl groups, exemplary oxiranylalkyl groups of $R^3$ including 4-oxiranylbutyl group and 8-oxiraniloctyl groups, and exemplary acyloxyalkyl groups of $R^3$ including acetoxypropyl groups and 3-methacryloxypropyl groups. In particular, $R^3$ is preferably an alkyl group, an alkenyl group, or an alkoxy group, more preferably an alkyl group or an alkenyl group, with particularly suitable examples thereof including a group selected from a methyl group, vinyl group, allyl group, and hexenyl group.

Examples of such silatrane derivatives are the following compounds.

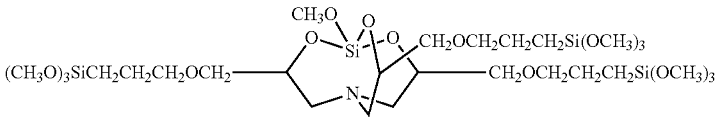

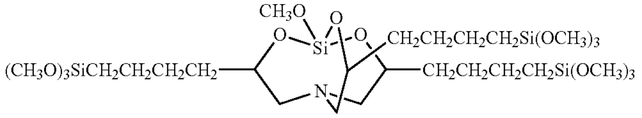

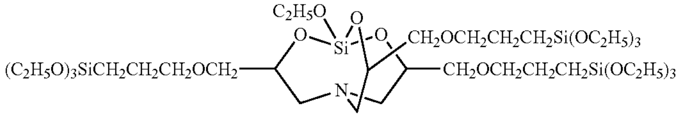

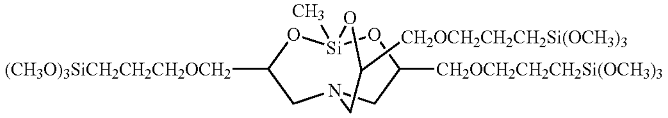

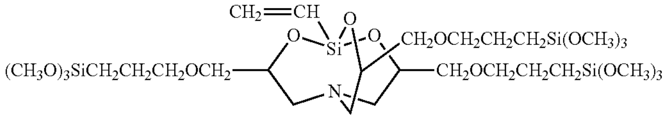

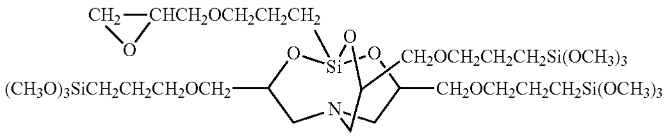

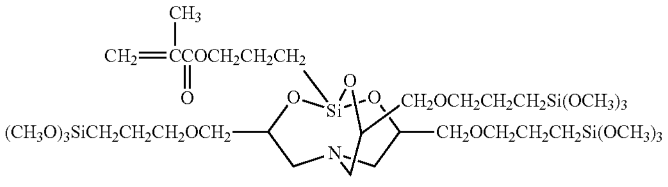

-continued
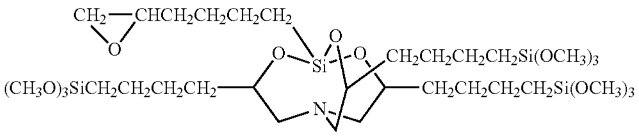
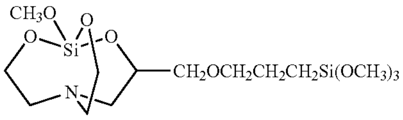
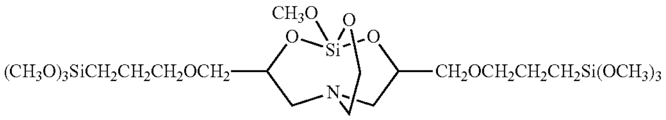
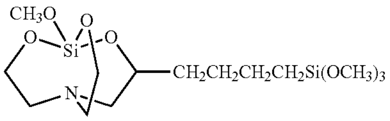
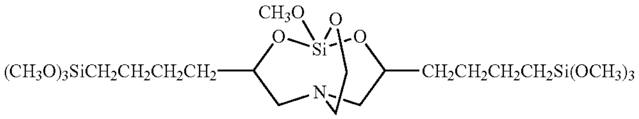
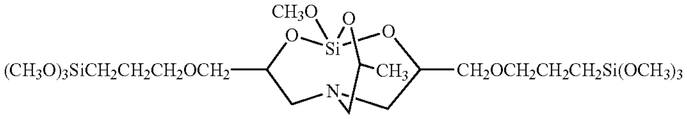
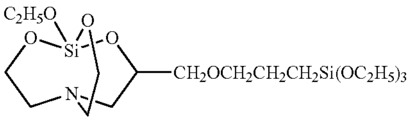
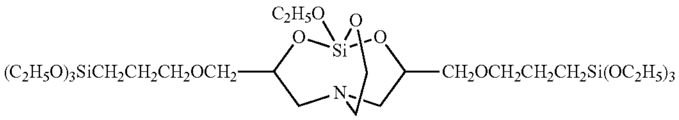
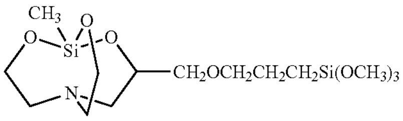
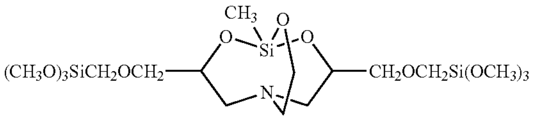
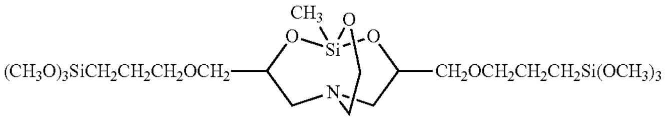
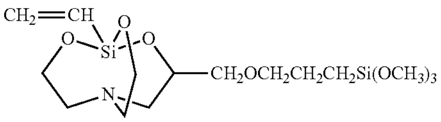
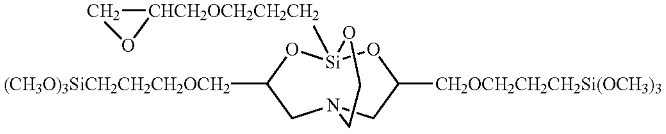

-continued

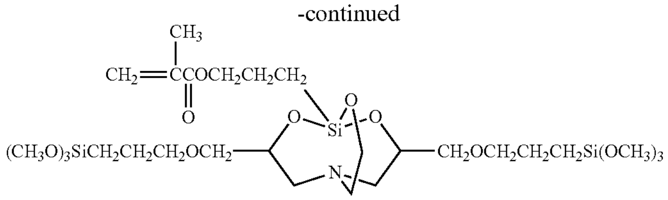

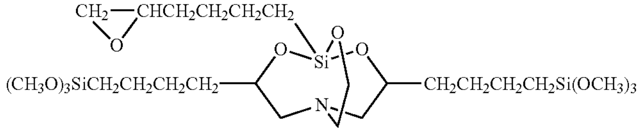

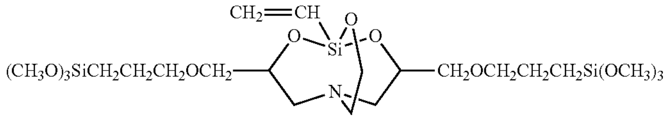

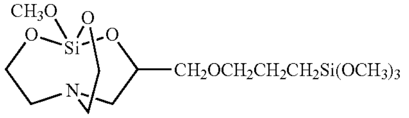

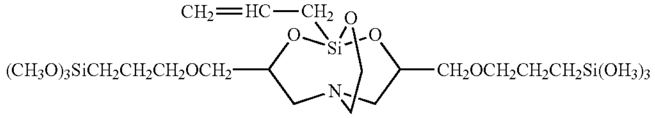

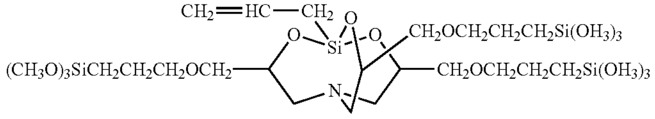

A carbasilatrane derivative is generated by the method described in JP H10-195085A, wherein an alkoxysilane having an amino group-containing organic group is reacted with an alkoxysilane having an epoxy group-containing organic group, and in particular by cyclization through alcohol replacement reaction and represented by the general formula:

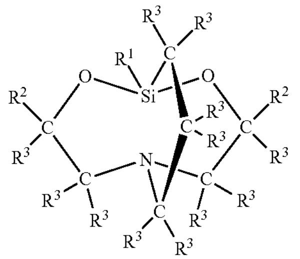

In this formula, $R^1$ is an alkyl group, an alkenyl group, or an alkoxy group, and $R^2$ is the same or different group selected from the group consisting of groups represented by the general formula:

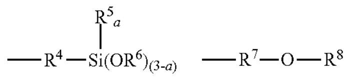

where $R^4$ is an alkylene group or alkyleneoxyalkylene group, $R^5$ is a monovalent hydrocarbon group, $R^6$ is an alkyl group, and a is 0, 1, or 2; or wherein $R^7$ is an alkylene group, $R^8$ is an alkyl group, alkenyl group, or acyl group; and $R^3$ is the same or different hydrogen atom or alkyl group. Exemplary carbasilatrane derivatives may include that having a silicon atom-bonded alkoxy group or a silicon atom-bonded alkenyl group per molecule, represented by the following structure:

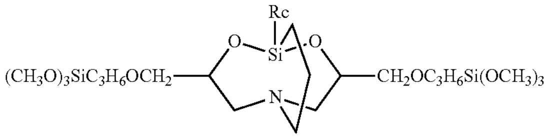

wherein Rc is a group selected from a methoxy group, ethoxy group, vinyl group, allyl group and hexenyl group).

While the amount of component (B) to be used is not particularly limited, in terms of improving adhesion to a difficult-to-adhere substrate, the amount is suitably within a range of 0.1 to 1.0 mass % relative to the composition as a whole, and more preferably within a range of 0.2 to 1.0 mass % thereof. Moreover, the blending amount of component (B) may be within a range of 0.1 to 50 parts by mass, or within a range of 0.1 to 40 parts by mass, relative to 100 parts of components (A1).

[Component (C)]

Component (C) is a curing agent for curing component (A) described above, and is specifically one or more curing agents selected from (c1) or (c2) below. Two or more of these curing agents may be used in combination, for example, the cure system may include both a (c1) component and a (c2) component.

(c1) an organic peroxide;

(c2) An organohydrogenpolysiloxane having at least two silicon atom-bonded hydrogen atoms in one molecule and a hydrosilylation reaction catalyst. (c1) Organic peroxide is a component that cures component (A) described above by heating, and examples include alkyl peroxides, diacyl peroxides, ester peroxides, and carbonate peroxides.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di (tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethylbutylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

This organic peroxide preferably has a 10-hour half-life temperature of not lower than 90° C. or not lower than 95° C. Examples of this manner of organic peroxide include dicumyl peroxide, di-tert-butyl peroxide, di-tert-hexyl peroxide, tert-butylcumyl peroxide, 2,5-dimethyl-2,5-di(tert-butylperoxy)hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

While not limited thereto, the content of the (c1) organic peroxide is preferably within the range of 0.05 to 10 mass parts, or within the range of 0.10 to 5.0 mass parts, with regard to 100 mass parts of component (A).

Component (c2), an organohydrogenpolysiloxane having at least two silicon-bonded hydrogen atoms and a hydrosilylation reaction catalyst, is a component that cures the composition by an addition reaction (hydrosilylation reaction) of the organohydrogenpolysiloxane, a crosslinking agent, with the carbon-carbon double bond in component (A) in the presence of the hydrosilylation reaction catalyst.

The structure of organohydrogenpolysiloxane, the crosslinking agent, is not particularly limited and may be straight-chain, branched-chain, cyclic, or resinous. In other words, component (c2) may be an organohydrogenpolysiloxane having, as the main constituent unit, a hydrogen organosiloxy unit represented by $HRSiO_{2/2}$ ($D^H$ unit, wherein R is independently a monovalent organic group), and at the end thereof a hydrogen diorganosiloxy unit represented by $HR_2SiO_{1/2}$($M^H$ unit, wherein R is independently a monovalent organic group). In particular, in the case of applications other than the molding process described below, even if the curable silicone composition is a straight-chain organohydrogenpolysiloxanes made up of the $D^H$ units described above, sufficient curing is possible for practical use.

On the other hand, when the curable silicone composition is used in a molding process, since the content of the curable reactive functional group containing a carbon-carbon double bond in the composition is small, from the viewpoint of curing speed, moldability, and curing properties thereof, it is preferable that the organohydrogenpolysiloxane is an organohydrogenpolysiloxane resin that contains in a molecule a monoorganosiloxy unit represented by $RSiO_{3/2}$ (T unit, wherein R is a monovalent organic group or a silicon atom-bonded hydrogen atom) or a siloxy unit represented by $SiO_{4/2}$ (Q unit), and at least two hydrogen diorganosiloxy units represented by $HR_2SiO_{1/2}$ ($M^H$ unit, where R is independently a monovalent organic group), and having the $M^H$ unit at the molecular terminals.

A particularly suitable organohydrogenpolysiloxane is an organohydrogenpolysiloxane resin represented by the following average unit formula:

$$(R^5{}_3SiO_{1/2})_l(R^6{}_2SiO_{2/2})_m(R^6SiO_{3/2})_n(SiO_{4/2})_p(R^2O_{1/2})_q.$$

In the formula, each $R^5$ is the same or different hydrogen atom or monovalent hydrocarbon group having 1 to 10 carbon atoms without an aliphatic unsaturated carbon bond, wherein at least two $R^5$ in one molecule are hydrogen atoms. Other than hydrogen atom, examples of the monovalent hydrocarbon group $R^5$ include methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group; and the like. From an industrial viewpoint, methyl groups or phenyl groups are preferred.

In the formula, $R^6$ is a monovalent hydrocarbon group having 1 to 10 carbon atoms without an aliphatic unsaturated carbon bond, and the examples are the same group as the monovalent hydrocarbon group described above. On the other hand, $R^2$ is a hydrogen atom or an alkyl group having 1 to 10 carbon atoms, and examples of the $R^2$ alkyl group include methyl, ethyl, propyl, butyl, pentyl and hexyl. The relevant functional group $R^2O_{1/2}$ containing $R^2$ corresponds to the hydroxyl group or alkoxy group in the same component.

In the formula, I, m, n and p are numbers that satisfy the following: $0.1 \leq l \leq 0.80$, $0 \leq m \leq 0.5$, $0 \leq n \leq 0.8$, $0 \leq p \leq 0.6$, $0 \leq q \leq 0.05$, wherein $n+p>0.1$ and $l+m+n+p=1$. Here, when the present composition is used in the molding process, the organohydrogenpolysiloxanes resin that is part of component (c2) are specifically preferred to be $M^H$MT resin, $M^H$MTT$^H$ resin, $M^H$MTQ resin, $M^H$MQ resin, $M^H$MTT$^H$Q, or $M^H$Q resin.

Particularly suitable is the organohydrogenpolysiloxane which is part of component (c2) and is a MHQ resin represented by $$(H(CH_3)_2SiO_{1/2})_{l1}(SiO_{4/2})_{p1}.$$

Here, $l1+p1=1$, and it is preferable to have $0.1 \leq l1 \leq 0.80$ and $0.20 \leq p1 \leq 0.90$.

Similarly, the organohydrogenpolysiloxane that is part of component (c2) may include straight-chain diorganopolysiloxane, organohydrogenpolysiloxane, or diorganopolysiloxane-organohydrogensiloxane copolymer, whose molecular chain ends are capped by silicon-bonded hydrogen atoms or trimethylsiloxy groups. The degree of siloxane polymerization of these straight-chain organohydrogenpolysiloxanes is not particularly limited, but is in the range of 2 to 200, and is preferably in the range of 5 to 100.

The amount of the organohydrogenpolysiloxane, which is a part of component (c2), is an amount sufficient to cure the curable silicone composition of the present invention and relative to the curable reactive functional group (for example, an alkenyl group such as a vinyl group) containing a carbon-carbon double bond in component (A), the molar ratio of the silicon-bonded hydrogen atom in the organohydrogenpolysiloxane is 0.5 or more and preferably in the range of 0.5 to 20. In particular, when component (c2) includes the organohydrogenpolysiloxane resin described above, the amount thereof is set so that, relative to the curable reactive functional group containing a carbon-carbon double bond in component (A), the molar ratio of the silicon-bonded hydrogen atom in the organohydrogenpolysiloxane resin is in the range of 0.5 to 20, and preferably in the range of 1.0 to 10.

Examples of the hydrosilylation reaction catalyst that is a part of component (c2) include platinum-based catalysts, rhodium-based catalysts, and palladium-based catalysts. Platinum-based catalysts are preferred due to the ability to remarkably promote curing of the present composition. Examples of platinum-based catalysts include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin, or the like, with a platinum-alkenyl siloxane complex being particularly preferable. Examples of alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. In particular, 1,3-divinyl-1,1,3,3-tetramethyldisiloxane is preferably used because of the favorable stability of this platinum-alkenylsiloxane complex, and is preferably added in the form of a complex alkenylsiloxane solution. In addition, in terms of improving the handleability as well as the pot life of the composition, a platinum containing hydrosilylation reaction catalyst in microparticulate dispersed and encapsulated with thermoplastic resin may be used. As the catalyst for promoting the hydrosilylation reaction, a non-platinum based metal catalyst such as iron, ruthenium, iron/cobalt, or the like may be used.

The amount of the hydrosilylation reaction catalyst, which is a part of component (c2), should be an amount in which a metal atom is in the range of 0.01 to 500 ppm, 0.01 to 100 ppm, or preferably 0.01 to 50 ppm in terms of mass units relative to the entire composition.

Particularly suitable components (c2) include at least an organohydrogenpolysiloxanes resin represented by the average unit formula (c2-1) described above, and a hydrosilylation reaction catalyst.

When the hydrosilylation reaction catalyst described above is used as a part of component (C), inclusion of the catalyst in the organopolysiloxane microparticles such as component (A1-1) and component (A1-2) when they are produced is preferable from the viewpoint of the storage stability of this curable silicone composition. However, the entire mixture made up of the microparticles preferably does not become curing reactive on its own.

In addition to the above-described components (A) to (C), the curable silicone composition of the present invention further comprises (D) functional filler, from the standpoint of its ability to improve the problem of stickiness of the entire composition at room temperature, and when cured at high temperature after heat-melting (hot-melting), to provide the cured product with the desired functions and excellent hardness and toughness at room to high temperature.

[Component (D)]

Component (D) of the present invention is a functional filler, which is preferably at least one filler that does not have a softening point or does not soften below 50° C. It may be a component that improves the workability of the composition and imparts mechanical or other properties to the cured product of the composition. Examples of component (D) include inorganic fillers, organic fillers, and mixtures thereof, and inorganic fillers are preferable. Examples of the inorganic filler include reinforcing fillers, white pigments, heat conductive fillers, conductive fillers, phosphors, and mixtures of two types or more thereof. Examples of the organic filler include a silicone resin filler, a fluorine resin filler, and a polybutadiene resin filler. The shape of these fillers is not particularly limited, and may be spherical, spindle-shaped, flat, needle-shaped, amorphous, or the like.

Since the present composition imparts mechanical strength and improves protection properties and adhesiveness in the cured product when used in encapsulants, protective agents, adhesives, and light reflection material and such applications, reinforcing filler is preferably blended in as component (D). Examples of the reinforcing filler include fumed silica, precipitated silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may also be surface treated with organoalkoxysilanes such as methyltrimethoxysilane; organohalosilanes such as trimethylchlorosilane; organosilazanes such as hexamethyldisilazane; siloxane oligomers such as dimethylsiloxane oligomers capped with α,ω-silanol groups, methylphenylsiloxane oligomers capped with α,ω-silanol groups, methylvinylsiloxane oligomers capped with α,ω-silanol groups, or the like. Further, as the reinforcing filler, a fibrous filler such as calcium metasilicate, potassium titanate, magnesium sulfate, sepiolite, zonolite, aluminum borate, rock wool, glass fiber, or the like may be used.

Component (D) may be of any particle diameter, but if gap fill properties are to be imparted to the composition, an average particle size of 10 μm or less is preferably used, and if the amount of component (D) to be added is to be increased to the extent possible from the viewpoint of imparting functionality, combining of different particle diameters in order to improve the packing property of the filler is preferable.

In the present composition, component (D) may be surface-treated to improve the melting properties of the resulting composition. Component (D) is preferably treated with a specific surface treatment agent, in particular, 0.1 to 2.0 mass %, 0.1 to 1.0 mass %, 0.2 to 0.8 mass % of the total mass of component (D). Treating component (D) with a surface treatment agent in the treatment amount described above enables the advantage that component (D) can be stably blended at a high volume percentage in the composition. The surface treatment method is optional, and any desired method can be used, such as a uniform mixing method using mechanical force (dry method) or a wet mixing method using a solvent.

Examples of these surface treatment agents include methylhydrogenpolysiloxane, silicone resins, metal soaps, silane coupling agents, and fluorine compounds such as perfluoroalkylsilane and perfluoroalkylphosphate ester salts; however, the silicone-based surface treatment agents described below are particularly preferable. Note that when a silane-based surface treatment agent such as methyltrimethoxysilane or phenyltrimethoxysilane is selected as the surface treatment agent of component (D), the hot-melt properties of the overall composition may be diminished, and also, component (D) may not be stably compounded to the amount indicated by the volume % described above. Moreover, when an alkyltrialkoxysilane having a long-chain alkyl group such as an octyl group is selected as a surface treatment agent, it tends to enable maintaining the hot-melt properties of the composition and the compounding stability of component (D); however, the strength of the cured product obtained by curing the composition of the present invention may be negatively affected, potentially causing cracking or molding defects.

In contrast, although the silatrane derivative and the carbasilatrane derivative, which are component (B), have alkoxy groups as these silane compounds do, when these are mixed in with the surface treatment agent described herein, there is advantageously no effect of deteriorating the melt characteristics of the composition or the strength of the cured product, causing no adverse effects.

Examples of organic silicon compounds that are surface treatment agents include low molecular weight organic silicon compounds such as silanes, silazanes, siloxanes, and the like, along with organic silicon polymers or oligomers such as polysiloxanes, polycarbosiloxanes, and the like. A so-called silane coupling agent is an example of a preferred silane. Typical examples of the silane coupling agents include alkyltrialkoxysilanes (such as methyltrimethoxysilane, vinyltrimethoxysilane, hexyltrimethoxysilane, octyltrimethoxysilane, decyltrimethoxysilane, and the like) and trialkoxysilanes containing an organic functional group (such as g lycidoxypropyltri methoxysi lane, epoxycyclohexyl ethyltrimethoxysilane, methacryloxypropyltrimethoxysilane, aminopropyltrimethoxysilane, and the like).

Preferred siloxanes and polysiloxanes include hexamethyldisiloxanes, 1,3-dihexyl-tetramethyldisiloxanes, trialkoxysilyl single-terminated polydimethylsiloxanes, trialkoxysilyl single-terminated dimethylvinyl single-terminated polydimethylsiloxanes, trialkoxysilyl single-terminated organic functional group single-terminated polydimethylsiloxanes, trialkoxysilyl doubly-terminated polydimethylsiloxanes, organic functional group doubly-terminated polydimethylsiloxanes, and the like. When a siloxane is used, the number of siloxane bonds "n" is preferably within a range of 2 to 150. Examples of preferred silazanes include hexamethyldisilazanes, 1,3-dihexyl-tetramethyldisilazanes, and the like. An example of a preferred polycarbosiloxane is a polymer having an Si—C—C—Si bond in a polymer main chain.

An example of a particularly suitable silicone-based surface treatment agent is an agent having at least one polysiloxane structure and a hydrolyzable silyl group per molecule. Most suitable examples are, straight-chain organopolysiloxanes having a alkoxysilyl terminal, represented by Structural formula:

$$R'_n(RO)_{3-n}SiO—(R'_2SiO)_m—SiR'_n(RO)_{3-n}$$

or

Structural formula:

$$R'_3SiO—(R'_2SiO)_m—SiR'_n(RO)_{3-n}$$

In the formulae, R is a hydrogen atom or an alkyl group having 1 to 3 carbon atoms (=methyl group, ethyl group, or propyl group), while each R' is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, exemplified by the same groups as those described above. n is a number in the range of 0 to 2, while m is a number in the range of 2 to 200 and may be a number in the range of 2 to 150.

Component (D) may contain silicone microparticles which do not correspond to component (A1-1, -2), and the stress relief properties and the like can be improved or adjusted as desired. Silicone microparticles include non-reactive silicone resin microparticles and silicone elastomer microparticles, but silicone elastomer microparticles are suitable examples from the standpoint of improving flexibility or stress relief properties.

Silicone elastomer microparticles are a crosslinked product of straight-chain diorganopolysiloxane primarily comprising diorganosiloxy units (D-units). The silicone elastomer microparticles can be prepared by a crosslinking reaction of diorganopolysiloxane by a hydrosilylation reaction, a condensation reaction of a silanol group or the like, and in particular, the silicone elastomer microparticles can be suitably obtained by a crosslinking reaction of organohydrogenpolysiloxane having a silicon-bonded hydrogen atom at a side chain or a terminal with diorganopolysiloxane having an unsaturated hydrocarbon group such as an alkenyl group at a side chain or a terminal, in the presence of a hydrosilylation reaction catalyst. The silicone elastomer microparticles may have various shapes such as spherical, flat, and irregular shapes, but spherical form is preferable in terms of dispersibility, with true spherical being more preferable among these. Commercially available products of such silicone elastomer microparticles include, for example, "TREFIL™-E series" and "EP Powder series" manufactured by Dow Toray Company, Ltd., and "KMP series" manufactured by Shin-Etsu Chemical Co., Ltd. The silicone elastomer microparticles may be subjected to a surface treatment. Examples of the surface treatment agent include, for example, methylhydrogenpolysiloxane, silicone resin, metal soap, silane coupling agent, inorganic oxide such as silica and titanium oxide, fluorine compound such as perfluoroalkylsilane and perfluoroalkylphosphate ester salt.

When the present composition is used as a wavelength conversion material for an LED, a phosphor may be blended in as component (D) to convert the wavelength of the emission from the optical semiconductor element. There is no particular limitation to such phosphors, with examples thereof including yellow, red, green, and blue light phosphors, which comprise oxide phosphors, oxynitride phosphors, nitride phosphors, sulfide phosphors, oxysulfide phosphors, and the like, that are widely used in light emitting diodes (LED). Examples of the oxide phosphors include: yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. In the composition, two or more of these phosphors may be used in combination.

Furthermore, the composition may contain thermally conductive filler or electroconductive filler to impart thermal or electrical conductivity to the cured product. As the thermally conductive filler or the electric conductive filler, exemplified are: metal fine powders such as gold, silver, nickel, copper, aluminum; fine powders obtained by depositing or plating a metal such as gold, silver, nickel, copper or the like on the surface of a fine powder such as ceramic, glass, quartz, organic resin or the like; metal compounds such as aluminum oxide, magnesium oxide, aluminum nitride, boron nitride, zinc oxide, or the like; graphite; and a mixture of two or more of these. When electrical insulation is required for the present composition, a metal oxide-based powder or a metal nitride-based powder is preferable, and in particular, an aluminum oxide powder, a zinc oxide powder, or an aluminum nitride powder is preferable.

Although the amount of component (D) is not restricted, the amount should be at least 10% by volume of the entire composition, preferably 20% or more by volume, more preferably 30% or more by volume, and particularly suitably within the range of 30 to 90% by volume from the viewpoint of imparting functionality to the resulting cured product.

The present composition may also optionally contain hot-melt microparticles, curing retardants, and adhesion promoters as other components, as long as the purpose of the present invention is not impaired.

As for hot-melt microparticles other than component (A), one or more types selected from various hot-melt synthetic resins, waxes, fatty acid metal salts, and the like can be used. The wax component exhibits low kinematic viscosity at high temperatures (150° C.) and forms a melt with excellent flowability. In addition, by combining components (A) to (C) described above, the wax component in the melt that comprises the present composition spreads quickly throughout the composition at high temperatures, thereby lowering the viscosity of the substrate surface to which the molten composition is applied and of the composition as a whole, rapidly lowering the surface friction of the substrate and the molten composition, and significantly increasing the fluidity of the composition as a whole. Therefore, the viscosity and flowability of the molten composition can be greatly improved by adding only a very small amount of a wax component to the total amount of other components.

The wax component may be a petroleum wax such as paraffin as long as it satisfies the conditions of drip point and kinematic viscosity at the time of melting described above; however, in terms of the technical effect of the present invention, a hot-melt component comprising a fatty acid metal salt and a fatty acid ester of an erythritol derivative is preferable, with a metal salt of a higher fatty acid such as stearic acid, palmitic acid, oleic acid, and isononanoic acid, pentaerythritol tetrastearate, dipentaerythritol adipic acid stearic acid ester, glycerine tri-18-hydroxy stearate, and pentaerythritol full stearate being particularly preferable. Here, the types of fatty acid metal salts described above are also not particularly limited, with suitable examples including: alkali metal salts such as lithium, sodium, potassium, and the like; alkaline earth metal salts such as magnesium, calcium, barium, and the like; or zinc salts.

Particularly suitable as the wax component are fatty acid metal salts and erythritol derivatives having a free fatty acid content of 5.0% or less, particularly preferably 4.0% or less, and 0.05 to 3.5%. Examples of such a component include at least one or more stearic acid metal salts and the like. Specifically, the use of a hot-melt component which has a melting point of 150° C. or lower and is selected from calcium stearate (melting point:

150° C.), zinc stearate (melting point: 120° C.), magnesium stearate (melting point: 130° C.), pentaerythritol tetrastearate (melting point: 60 to 70° C.), pentaerythritol adipic acid stearic acid ester (melting point: 55 to 61° C.), pentaerythritol full stearate (melting point: 62 to 67° C.), and the like is most preferable.

The amount of the wax component used, taking the overall composition as 100 mass parts, may be in the range of 0.01 to 5.0 mass parts and may be 0.01 to 3.5 mass parts or 0.01 to 3.0 mass parts. If the amount of the wax component used exceeds the upper limit, the adhesiveness and mechanical strength of the cured product obtained from the cured silicone composition of the present invention may be insufficient. If the amount used is less than the lower limit, sufficient fluidity while heating and melting may not be achieved.

Examples of the curing retardant include: alkyne alcohols such as 2-methyl-3-butyn-2-ol, 3,5-dimethyl-1-hexyn-3-ol, 2-phenyl-3-butyn-2-ol, and 1-ethynyl-1-cychlohexanol; enyne compounds such as 3-methyl-3-penten-1-yne, and 3,5-dimethyl-3-hexen-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl tris(1,1-dimethyl propynyloxy)silane and vinyl tris(1,1-dimethyl propynyloxy)silane. The amount of the curing retardant is not limited, but is preferably within the range of 10 to 10,000 ppm in terms of mass units, relative to the composition.

Furthermore, the composition may optionally contain, as other components, heat resistance agents such as iron oxide (red iron oxide), cerium oxide, cerium dimethyl silanolate, fatty acid cerium salt, cerium hydroxide, zirconium compound, and the like, and also dyes, pigments other than white, flame retardant agents, and the like, as long as the purpose of the present invention is not impaired.

[Storage Elastic Modulus of the Cured Product]SUBSTITUTE SPECIFICATION

Specifically, the cured product formed by curing the above composition has a storage modulus (G') value of 500 MPa or less at 25° C. The cured product is flexible, has superior adhesion and followability to substrates such as semiconductor substrates, and can be used for encapsulating semiconductor devices that are subject to deformation, such as flexible semiconductor substrates that have been introduced in recent years, suppressing damage to the encapsulated semiconductor device or generation of defects such as delamination and voids. For applications requiring particularly high elongation and followability regarding deformation, the value of the storage modulus (G') at 25° C. is preferably 400 MPa or less, and more preferably 300 MPa or less.

[Tensile Elongation of Cured Material]

Further, the cured product comprising the cured composition of the present invention must have a tensile elongation rate of 30% or more, as measured by the method specified in JIS K 6251-2010 “Vulcanized Rubber and Thermoplastic Rubber—Determination of Tensile Properties". The cured product is flexible, has superior adhesion and followability to substrates such as semiconductor substrates, and can be used for encapsulating semiconductor devices that are subject to deformation, such as flexible semiconductor substrates that have been introduced in recent years, suppressing damage to the encapsulated semiconductor device or generation of defects such as delamination and voids. For applications requiring particularly high elongation and followability regarding deformation, the elongation rate is preferably 40% or more, and more preferably 50% or more.

[Use of the Present Composition]

The present composition may take the form of granules, pellets, or sheets depending on the manufacturing process thereof. When the composition is to be used in the pellet form, the pellets can be efficiently produced by tableting the granulated present composition. A "pellet" may also be referred to as a "tablet". The shape of the pellet is not limited, but is usually spherical, elliptical spherical, or cylindrical. The size of the pellet is not limited, and for example, has an average particle diameter or a circle equivalent diameter of 500 μm or more.

The present composition may be molded into a sheet and used. For example, a sheet made of a curable silicone composition having an average thickness of 100 to 1,000 μm is advantageous in that it has hot-melt properties and heating-curability at high temperatures and therefore demonstrates particularly excellent workability and melting characteristics when used in compression molding or the like. Such a sheet-like composition may be produced by integrating the curable granular composition obtained by the aforementioned method with a uniaxial or biaxial continuous kneading machine at low temperatures then forming to a prescribed thickness between two rollers or the like.

[Use as Laminates and Film Adhesives]

The present composition can be used in sheet form, in particular as a laminate, having a structure including a sheet-like member comprising the above described curable silicone composition between two film-like substrates that are equipped with a release layer.

The method for manufacturing such a releasable laminate is not particularly limited, but can be achieved via a method for manufacturing a curable silicone sheet, including:

Step 1: a step of mixing each component of the curable silicone composition described above;

Step 2: a step of kneading the mixture obtained in step 1 while heat-melting;

Step 3: a step of laminating the mixture (obtained after heat-melting in step 2) between two films, each having at least one release surface; and Step 4: a step of extending the laminate obtained in step 3 between rollers to mold a curable silicone sheet having a specific film thickness.

Herein, a roll having a cooling or temperature adjustment function may be used in step 4, etc., and the method may optionally have a step of cutting the laminate including the obtained curable silicone sheet after step 4.

The type of film substrate is not particularly limited, with polyester film, polyolefin film, polycarbonate film, acrylic film, and the like capable of being used as appropriate. The sheet-like substrate is preferably non-porous.

The release layer is necessary for easily peeling off the sheet-like material consisting of the curable silicone composition from the film-like substrate and is sometimes called a release liner, separator, release layer, or release coating layer. Preferably, the release layer can be a silicone release agent, a fluorine release agent, an alkyd release agent, a release layer with a release coating function such as a fluorosilicone release agent and the like, or a substrate itself that is difficult for the adhesive material layer to adhere to, made up of the curing-reactive silicone adhesive composition of the present invention or the cured product thereof or having miniscule physical unevenness on the surface. In particular, in the laminated body of the present invention, a release layer obtained by curing a fluorosilicone-based release agent is preferably used as the release layer.

The laminate described above can be used, for example, by applying the sheet-like member made up of the curable silicone composition to the adherend, followed by peeling off the sheet-like member in an uncured state from the film-like substrate.

Here, the sheet-like member made up of the curable silicone composition has a thickness of 1 mm or less and may be a film-like adhesive. In other words, the laminate may and preferably includes a releasable film adhesive retained by a substrate film. Since the film adhesive has hot-melt properties, it may be used as an adhesive for temporary fixing of semiconductor components, and the like, and may be used as a die attach film.

Moreover, the sheet-like member made up of the curable silicone composition may be molded together with the substrate by compression molding or press molding as is. Here, molding may be performed leaving the film-like substrate on one side, where the film functions as a release film to prevent adhesion to the mold during molding.

The composition of the present invention is non-fluid at 25° C. Here, the term "non-fluid" means that deforming or flowing does not occur in a no-load state and preferably does not deform or flow in a no-load state at 25° C. when molded into a pellet, a tablet, or the like. Such non-fluidity can be evaluated, for example, by placing a molded product of the composition on a hot plate at 25° C. and seeing no substantial deforming or flowing under no load or constant weight occurs. This is because, when non-fluid at 25° C., shape retention at this temperature is good and the surface tackiness is low.

The softening point of the composition is preferably 100° C. or less. Such a softening point means the temperature at which the deformation amount in the height direction is 1 mm or more when the deformation amount of the composition is measured after the load is removed by continuing to press the hot plate with a load of 100 grams for 10 seconds from above.

The present composition tends to decrease in viscosity rapidly under high temperature and high pressure (that is, in the molding step), with values measured at similar high temperatures and high pressures preferably used as a useful melt viscosity value. Therefore, the melt viscosity of the present invention is more preferably measured under high pressure using a Koka-type flow tester (manufactured by the Shimadzu Corporation) than when measured with a rotational viscometer such as a rheometer. Specifically, the present composition should have a melt viscosity at 150° C. of 200 Pa·s or less, more preferably 150 or less. This is because the adhesiveness to the base material after the composition is hot-melted and then cooled to 25° C. is good.

[Method for manufacturing the Granular Curable Silicone Composition]

The present composition can be manufactured as a granular composition by powder-mixing components (A) to (D) and other optional components at a temperature lower than the softening point of component (A). The powder mixer used in the present manufacturing method is not limited, with examples including a uniaxial or biaxial continuous mixer, a two-roll mixer, a ROSS mixer, a Hobart mixer, a dental mixer, a planetary mixer, a kneader mixer, a Labo Millser (Osaka Chemical Co.), a small grinder, and a henschel mixer, preferably a Labo Millser, a small grinder, or a henschel mixer.

[Method of Manufacturing the Curable Silicone Sheet]

The curable silicone sheet according to the present invention has hot-melt properties and comprises a curable silicone composition that includes an organopolysiloxane resin, a curing agent, and a functional filler, wherein the manufacturing method of the present invention includes the following steps 1 to 4.

Step 1: a step of mixing each component of the curable silicone composition

Step 2: a step of kneading the mixture obtained in step 1 while heat-melting at a temperature of 50° C. or higher;

Step 3: a step of laminating the mixture (obtained after heat-melting in step 2) between two films, each having at least one release surface; and Step 4: a step of extending the laminate obtained in step 3 between rollers to mold a curable silicone sheet having a specific film thickness.

Here, "having hot-melt properties" refers to a property in which the softening point is within a range of 50° C. to 200° C. and having properties of softening or flowing upon heating. Moreover, regardless of the hot-melt properties of the component of the organopolysiloxane resin microparticles of the curable silicone sheet according to the present invention, it is sufficient if the mixture of the organopolysiloxane resin microparticles, the curing agent, and the functional filler is hot-meltable.

Step 1

Step 1 above is a step of mixing a curable granular silicone composition containing an organopolysiloxane resin (suitably in a microparticle form), a curing agent, and a functional filler, which are components of the curable silicone composition. Each of these components is as described above.

The mixture provided by step 1 is a curable granular silicone composition and has hot-melt properties as a mixture as a whole. On the other hand, the mixture is non-fluid at 25° C. Here, the term "non-fluid" means that deforming or flowing does not occur in a no-load state and preferably does not deform or flow in a no-load state at 25° C. when it is molded into a pellet, a tablet, or the like. Such state of non-fluidity can be evaluated, for example, by placing a molded product of the composition on a hot plate at 25° C. and seeing no substantial deformation or flowing under no load or constant weight occurs. This is because, when non-fluid at 25° C., shape retention at this temperature is good and the surface tackiness is low.

The softening point of the mixture provided by step 1 is 200° C. or lower, and preferably 150° C. or lower. Such a softening point means the temperature at which the deformation amount in the height direction is 1 mm or more when first continuing to press the hot plate with a load of 100 grams for 10 seconds from above and then removing the load, at which time the deformation amount of the composition is measured.

When the softening point of the mixture provided by step 1 is 200° C. or lower, by heating the entire mixture to a temperature higher than the softening point of the mixture in the below-mentioned step 2, the mixture can be heat-melted to give a certain level of fluidity. A curable silicone sheet consisting of the curable granular silicone composition and having hot-melt properties can be obtained by molding the softened material or the melt.

The step of mixing the organopolysiloxane resin, the curing agent, the functional filler, and other optional components is not particularly limited, and the mixture can be manufactured by mixing the powder materials at a temperature below the softening point of the entire mixture and preferably below that of the organopolysiloxane resin microparticles. The powder mixer used in the present manufacturing method is not limited, with examples including a uniaxial or biaxial continuous mixer, a two-roll mixer, a ROSS mixer, a Hobart mixer, a dental mixer, a planetary mixer, a kneader mixer, a Labo Millser, a small grinder, and a henschel mixer, preferably a Labo Millser, a small grinder, or a henschel mixer.

Step 2

Step 2 is a step in which the mixture obtained in step 1 is kneaded while being heated and melted. By heating and kneading the mixture having heat-melting properties at a temperature above the softening point, preferably within a temperature range of 50° C. to 200° C., the entire composition is melted or softened, and the organopolysiloxane resin microparticles, curing agent, and functional filler can be uniformly and dispersed throughout the composition. When the mixture is press molded into a sheet shape in step 4 via step 3, a uniform thin-layer molded sheet can be formed with a single pressing step, with the practical benefit in avoiding molding defects and cracks in the sheet itself. In contrast, if the temperature is less than the above-mentioned lower limit, softening will be insufficient, likely making it difficult to obtain a molten or softened mixture (even upon using mechanical force) in which each component is uniformly dispersed throughout. Even if such a mixture is press molded into a sheet shape in step 4 via step 3, a uniform thin-layer molded sheet cannot be formed, potentially causing breakage or cracking of the sheet. Meanwhile, if the temperature exceeds the above-mentioned upper limit, the curing agent may react during mixing, potentially causing the entire mixture to undergo significant thickening or curing, thereby losing its hot-melt properties and forming a cured product. Therefore, when a hydrosilylation catalyst is used in component (C), a fine particulate platinum-containing hydrosilylation reaction catalyst dispersed or encapsulated with a thermoplastic resin is preferably used.

If the heat-melted viscosity of the mixture obtained in step 1 is low and fluidity is high, the mixture can be laminated on the release film after temporary molding in the below-mentioned step 3, making it preferable. Specifically, if the melt viscosity of the mixture, which is obtained in step 2 after heat-melting, and when determined at 150° C. using a Koka-type flow tester, is within a range of 1 to 1,000 Pas, temporary molding can be carried out in step 3.

In contrast, if the hot-melt viscosity of the mixture obtained in step 1 is high and fluidity is poor, in step 2, the mixture obtained in step 1 may be melted and kneaded at a temperature of its softening point or higher to obtain a uniform composition form, then laminated on the release film in step 3 without carrying out temporary molding.

The mixing apparatus in step 2 is not limited and may be: a batch type heating and kneading apparatus equipped with a heating/cooling function, such as a kneader, a Banbury mixer, a Henschel mixer, a planetary mixer, a 2-roll mill, a 3-roll mill, a Ross mixer, or a Labo Plastomill; or a continuous type heating and kneading apparatus equipped with a heating/cooling function such as a single screw extruder or a twin screw extruder, though not particularly limited, and is selected according to the efficiency of the processing time and the ability to control shear heat generation. Considering the processing time, the mixing apparatus may be a continuous heating and kneading apparatus such as a single screw extruder or a twin screw extruder, or may be a batch mixer such as a Labo Plastomill (Toyo Seiki). However, in terms of the production efficiency of the curable silicone sheet, a continuous heating and kneading apparatus such as a single screw extruder or a twin screw extruder is preferably used.

Step 3

Step 3 is a step of laminating the mixture (obtained after heat-melting in step 2) between two films each having at least one release surface, and is a preliminary step for press molding in step 4. By forming the laminate in which the mixture obtained in step 2 is sandwiched between films, press molding by rolling extension can be performed from on top of the film to obtain a sheet-like molded article, allowing only the film to be removed from the sheet-like molded article after molding using a release surface.

The mixture obtained after heat-melting in step 2 is laminated between two films. Depending on the form of use of the obtained curable silicone sheet, both films preferably have a release surface, and in step 3, the mixture obtained in step 2 is particularly preferably laminated between the release surfaces of the respective films. Such layered form enables the obtention of a laminated sheet wherein a thin-layer curable silicone sheet is sandwiched between releasable films that can be peeled from both sides via pressure molding in step 4 and optional subsequent cutting, and wherein, at use, the film on both sides can be peeled off to expose only the curable silicone sheet without concern for damaging the formed curable silicone sheet.

While the substrate of the film used in step 3 is not particularly limited, examples thereof include paperboard, cardboard paper, clay-coated paper, polyolefin laminate paper (polyethylene laminate paper, in particular), synthetic resin films/sheets, natural fiber cloth, synthetic fiber cloth, artificial leather cloth, and metal foils. Synthetic resin films and sheets are particularly preferable, with examples of synthetic resins including polyimide, polyethylene, polypropylene, polystyrene, polyvinyl chloride, polyvinylidene chloride, polycarbonate, polyethylene terephthalate, and nylon. When heat resistance is required, a heat-resistant synthetic resin film such as a polyimide, polyetheretherketone, polyethylene naphthalate (PEN), liquid crystal polyacrylate, polyamide-imide, polyether sulfone, and the like is particularly preferable. At the same time, for applications such as a display device in which visibility is required, a transparent substrate and specifically a transparent material such as a polypropylene, polystyrene, polyvinylidene chloride, polycarbonate, polyethylene terephthalate, PEN, or the like is preferable.

The thickness of the film is not particularly limited, but is usually from approximately 5 to 300 μm.

The film is preferably provided with at least one release layer, with the release layer preferably in contact with the mixture obtained in step 2. As a result, the hot-melt curable silicone sheet that is pressed and molded via steps 3 and 4 can easily be released from the film. The release layer may also be referred to as a release liner, a separator, a release layer, or a release coating layer and may preferably be a release layer having a release coating ability such as a silicone-based release agent, a fluorine-based release agent, an alkyd-based release agent, a fluorosilicone-based release agent, or the like, or may be formed as a substrate itself which is not prone to adhering to the hot-melt curable silicone sheet of the present invention by forming physically fine irregularities in the surface of the substrate.

In step 3, the mixture obtained in step 2 is laminated between two films. The step is not particularly limited; however, the mixture obtained in step 2 is supplied when discharged or applied onto a release layer of one film, while a laminate is formed by pasting together a release layer of the other film from above the mixture. At this time, in the manufacturing step of the continuous curable silicone sheet, each film is transported to the feed position of the mixture of step 2 via a rotary roll, at which time, a lamination operation is performed between the films.

The feed amount of the mixture obtained in step 2 between the films in step 3 can be designed according to the manufacturing speed and scale. As an example, a feed rate of 1 to 10 kg/hr of the mixture obtained in step 2 can be provided between the films; however, needless to say, the present invention is not limited thereto. However, in step 3, the amount of the mixture obtained in step 2 to be laminated between the films must be determined according to the average thickness of the curable silicone sheet designed in step 4, and, the thickness must be such that it is possible to carry out rolling in step 4.

If the hot-melt viscosity of the mixture obtained in step 1 is low and fluidity is high, in step 3, the mixture obtained after heating and melting in step 2 is preferably dispensed while molded into a film shape using a die and laminated between the films. Here, the die is used to temporarily mold the mixture, so the type and the thickness during temporary molding are not particularly limited; however, the composition can be temporarily molded to be generally in sheet shape having a thickness within a range of 100 to 2,000 μm (=2 mm) using a T-die, which is preferable.

If the hot-melt viscosity of the mixture obtained in step 1 is low and the fluidity is high, it is preferable to include the step of cooling the entire laminate obtained in step 3 or adjusting the temperature thereof as a step prior to step 4 or in step 4. This is because, when the heat-melted material is cooled into a solid state, the press molding in step 4 is effectively performed. The cooling step is not particularly limited, but can be performed by cooling the mixture (supplied or laminated on the film) within a range of −50° C. to room temperature utilizing cooling rolls, etc. via a cooling means (such as air cooling or a coolant). The details on temperature adjustment are described in step 4.

In contrast, if the hot-melt viscosity of the mixture obtained in step 1 is high and fluidity is poor, the semi-solid mixture may be fed and laminated onto the film without temporary molding in step 3.

Step 4

Step 4 is a step in which the laminate obtained in the above-mentioned step 3 is extended between rollers to form a curable silicone sheet having a specific film thickness, wherein the mixture obtained in step 2 is pressed and extended from on top of the film and molded into the form of a uniform curable silicone sheet.

The rolling process in step 4 can be performed using a known rolling method such as rolling extension on the laminate obtained in step 3. In particular, rolling extension is advantageous in that a curable silicone sheet of a desired thickness can be designed by adjusting the gap between rolls. For example, a curable silicone sheet having excellent flatness and very few defects on the sheet surface and inside the sheet can be obtained by adjusting the gap between the rolls to a constant level in which the average thickness is within a range of 10 to 2,000 μm, then rolling. More specifically, for rolling extension, the gap between the rollers is particularly preferably adjusted to be within a range of 1.5 to 4.0-fold the average thickness of the target organopolysiloxane cured film.

Extension can be performed as in step 4 to obtain a substantially flat curable silicone sheet having a thickness of 10 to 2000 μm. By rolling the heat-melted mixture of step 2 in a laminated form between the releasable films in step 3, it is possible to obtain a releasable laminate comprising a curable silicone sheet having hot-melt properties and low defects as well as excellent handling workability due to peeling.

[Temperature Adjustment in Step 4]

In step 4, when the laminate obtained in step 3 is extended between rolls, the rolls preferably further include a temperature adjustment function, and when performing rolling extension, the temperature of the entire laminate is preferably adjusted, and if necessary, heated or cooled. Due to this temperature adjustment, there is a practical advantage in that the gap between the rolls can be stably maintained and the flatness and uniformity (uniformity of film thickness) of the obtained hot-melt curable silicone sheet can be improved. The specific temperature adjustment range can be appropriately designed depending on the heat resistance of the film, the thickness of the curable silicone sheet (design thickness), the reactivity thereof, etc., but is generally within a range of 5 to 150° C.

[Cutting Step]

Step 4 may provide a releasable laminate in which a hot-melt curable silicone sheet is interposed between the releasable films, but may optionally have a step involving cutting a laminate containing the curable silicone sheet. Moreover, the curable silicone sheet may have a step involving winding via a winding apparatus. As a result, a releasable laminate including a hot-melt curable silicone sheet of a desired size can be obtained.

[Laminate]

The laminate obtained by the above-mentioned steps is a laminate configured including an organopolysiloxane resin microparticles, a curing agent, and a functional filler, wherein a curable silicone sheet having substantially flat hot-melt properties with a thickness of 10 to 2000 μm is laminated between films including at least one release surface. Note that the film may be provided together with a release surface, which is preferable.

[Curable Silicone Sheet]

The curable silicone sheet obtained by the manufacturing method of the present invention is a curable silicone composition comprising an organopolysiloxane resin microparticles, a curing agent, and a functional filler, has hot melt properties, and can be used as a heat meltable adhesive material. In particular, the curable silicone sheet can be used as a die attach film or film adhesive having excellent moldability, gap filling properties, and adhesive strength. Moreover, the sheet can also be suitably used as a curable silicone sheet for compression molding or press molding.

Specifically, the curable silicone sheet obtained via the manufacturing method of the present invention may be peeled from the releasable film, then disposed at a desired site such as a semiconductor. Subsequently, a film adhesive layer that utilizes gap filling properties with respect to irregularities or gaps may be formed on an adherend, followed by being temporarily fixed, disposed, and applied together between the adherends. Further, the curable silicone sheet may be heated to at least 150° C. and adhered between the adherends by the cured product of the curable silicone sheet. Note that the releasable film may be released after heating the curable silicone sheet and forming a cured product, wherein the release timing may be selected according to the application and use method of the curable silicone sheet.

Because the curable silicone sheet has hot-melt properties, it is possible to soften or fluidize the sheet by heating the sheet prior to final curing, and for example, thereby forming the adhesive surface by filling the unevenness or gap without any gap even if there are irregularities on the attached surface of the adherend. Exemplary heating means of the curable silicone sheet include various thermostatic baths, hot plates, electromagnetic heating apparatuses, heating rolls, etc. In order to perform application and heating more efficiently, for example, an electric heat press, a diaphragm type laminator, a roll laminator, etc. are preferably used.

[Method of Molding Cured Product]

The composition can be cured by a method including at least the following steps (I) to (III).

(I) a step of heating to a temperature of 100° C. or higher to melt the present composition;

(II) a step of injecting the curable silicone composition obtained in step (I) into a mold or a step involving distributing the curable silicone composition obtained in step (I) to a mold by clamping; and (III) a step of curing the curable silicone composition injected in step (II).

The composition can be suitably used in a molding method including a coating process in which overmolding and underfilling of a semiconductor device are simultaneously performed (so-called mold underfilling method). Furthermore, due to the characteristics described above, the composition can be suitably used in a molding method including a coating process (so-called wafer molding) in which the surface of a semiconductor wafer substrate on which a single or a plurality of semiconductor devices are mounted is covered and overmolded such that the gaps between the semiconductor devices are filled with the cured product.

In the above steps, a transfer molding machine, a compression molding machine, an injection molding machine, an auxiliary ram molding machine, a slide molding machine, a double ram molding machine, a low pressure sealing molding machine, or the like can be used. In particular, the composition of the present invention can be suitably used for the purpose of obtaining a cured product by transfer molding and compression molding.

Finally, in step (III), the curable silicone composition injected (applied) in step (II) is cured. When an organic peroxide is used as component (C), the heating temperature is preferably 150° C. or higher or 170° C. or higher.

Since it is suitable as a protective member for a semiconductor or the like, the cured product obtained by curing the present composition preferably has a type-D durometer hardness of 20 or more at 25° C. This type-D durometer hardness is determined by the type-D durometer in accordance with the JIS K 6253-1997 "Hardness Testing Methods for Vulcanized Rubber and Thermoplastic Rubber."

[Use of Composition]

The present composition has hot-melt properties, flowability while melted (hot-melt), and superior workability and curability, making it preferable as an encapsulant or underfill material for semiconductors, an encapsulant or underfill material for power semiconductors such as SiC, GaN, and the like, an encapsulant or light reflecting material for optical semiconductors such as light emitting diodes, photodiodes, phototransistors, laser diodes, and the like, or an electrical and electronic adhesive, potting agent, protecting agent, and coating agent. Since the composition has hot-melt properties, it is also suitable as a material for transfer molding, compression molding, or injection molding. In particular, it is suitable for use as an encapsulant for semiconductors that use the mold underfill method or the wafer molding method during molding. Furthermore, a sheet of this composition can be used as a curable film adhesive or as a buffer layer for stress between two substrates with different coefficients of linear expansion.

[Use of Cured Product]

Although the applications of the cured product of the present invention are not particularly limited, the composition of the present invention has hot-melt properties, superior moldability and gap-fill properties, and the cured product has the flexibility described above at room temperature, high stress relief properties, and flexural elongation. Therefore, the cured product obtained by curing the present composition can be suitably used as a member for a semiconductor device, and can be suitably used as an encapsulant for a semiconductor element, an IC chip or the like, a light reflecting material of an optical semiconductor device, and as an adhesive/bonding member of a semiconductor device.

The semiconductor device equipped with a member made of the cured product of the present invention is not particularly limited, but is particularly preferably a power semiconductor device, an optical semiconductor device, or a semiconductor device mounted on a flexible circuit base.

EXAMPLES

The hot-melt curable silicone composition of the present invention and manufacturing method thereof are described in detail by means of examples and comparative examples. Note that in the formulas, Me, Ph, and Vi represent a methyl group, a phenyl group, and a vinyl group, respectively. Moreover, the softening points and melt viscosity of the curable silicone compositions of each example and comparative example were determined by the methods described below. The curable silicone composition was heated at 150° C. for 2 hours to produce a cured product, and various adhesive strengths of the base material were measured using the following methods. The results are shown in Table 1.

[Softening Point of Curable Silicone Composition]

The curable silicone composition was molded into cylindrical pellets of φ14 mm×22 mm. The pellet was placed on a hot plate set at 25° C. to 100° C. and kept pressed from above for 10 seconds with a load of 100 grams, and after the load was removed, the amount of deformation of the pellet was measured. The temperature at which the deformation amount in the height direction was 1 mm or more was defined as the softening point.

[Melt Viscosity]

The melt viscosity of the curable silicone composition at 150° C. was measured using a nozzle having a diameter of 0.5 mm under 100 kgf of pressure with a CFT-500EX Koka-type flow tester (manufactured by Shimadzu Corporation).

[Die Shear Strength]

A curable silicone composition was placed at four locations, each approximately 500 mg, on various substrates of 25 mm×75 mm. Next, the composition was covered with a 10 mm square glass chip having a thickness of 1 mm, then heated and cured for two hours under conditions of temperature of 150° C. and thermal compression using a 1 kg plate. Thereafter, the mixture was cooled to room temperature and the die shear strength was determined using a shear strength determination apparatus (bond tester SS-100KP, available from Seishin Trading Co., Ltd.)

[Storage Elastic Modulus]

The curable silicone composition was heated at 150° C. for 2 hours to prepare a cured product. The storage modulus of the cured product from −50° C. to 250° C. was measured using a rheometer ARES (manufactured by TA Instruments Japan Inc.) and the values at 25° C. were read. Table 1 shows the values measured at 25° C.

[Tensile Elongation]

The curable silicone composition was heated at 150° C. for 2 hours to prepare a cured product. The tensile elongation rate of the cured product was measured using the method specified in JIS K 6251-2010 "Vulcanized Rubber and Thermoplastic Rubber—Determination of Tensile Properties."

Organopolysiloxane resins containing a hydrosilylation reaction catalyst were prepared by the methods shown in Reference Examples 1 and 2 below, and the hot-melt properties thereof were evaluated based on the presence or absence of softening point/melt viscosity. The organopolysiloxane resin microparticles were also prepared by the methods shown in Reference Examples 4 to 6. In the reference examples, the 1,1,3,3-tetramethyl-1,3-divinyl disiloxane used for the platinum complex that is the hydrosilylation reaction catalyst is described as "1,3-divinyltetramethyldisiloxane".

Reference Example 1

270.5 g of an Organopolysiloxane 55 mass % xylene solution represented by the average unit formula: $(Me_2ViSiO_{1/2})_{0.05}(Me_3SiO_{1/2})_{0.39}(SiO_{4/2})_{0.56}(HO_{1/2})_{0.02}$ as well as 0.375 g of platinum 1,3-divinyltetramethyldisiloxane complex 1,3-divinyltetramethyldisiloxane solution (platinum metal content=approximately 4,000 ppm) were introduced into a 1 L flask in white solid form at 25° C. and were stirred to uniformity at room temperature (25° C.) to prepare an organopolysiloxane resin (1) xylene solution containing 10 ppm in terms of mass units as platinum metal.

In addition, the organopolysiloxane resin (1) did not soften/melt even when heated to 200° C. and did not have hot-melt properties.

Reference Example 2

A xylene solution of a resinous organopolysiloxane (2) containing 10 ppm of platinum metal in mass units was prepared by introducing 270.5 g of a 55% by mass xylene solution of a resinous organopolysiloxane represented by the average unit formula:$(Me_3SiO_{1/2})_{0.44}(SiO_{1/2})_{0.56}(HO_{1/2})_{0.02}$ which is a white solid at 25° C., and 0.375 g of a 1,3-divinyltetramethyldisiloxane solution of platinum 1,3-divinyltetramethyldisiloxane complex (platinum metal content=approximately 4,000 ppm) into a 1 L flask and stirring until uniform at room temperature (25° C.).

In addition, the organopolysiloxane resin (2) did not soften/melt even when heated to 200° C. and did not have hot-melt properties.

Reference Example 3

Non-Hot-Melt Organopolysiloxane Resin Particles (1)

A xylene solution of the organopolysiloxane resin (1) prepared in Reference Example 1 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (1). The microparticles were observed using optical microscopy to have a particle diameter of 5 to 10 μm. The microparticles were exposed to 200° C. for 1 hour, and the loss on heating was 0.7 wt %.

Reference Example 4

Non-Hot-Melt Organopolysiloxane Resin Particles (2)

A xylene solution of the organopolysiloxane resin (2) prepared in Reference Example 2 was converted into particles while removing the xylene by a spray method using a spray dryer at 50° C. to obtain regular spherical shape microparticles. The microparticles were aged in an oven set at 120° C. for 24 hours to prepare regular spherical shape, non-hot-melt organopolysiloxane resin microparticles (2). The microparticles were observed using optical microscopy to have a particle diameter of 5 to 10 μm. The microparticles were exposed to 200° C. for 1 hour, and the loss on heating was 0.8 wt %.

Example 1

60.2 g of non-hot-meltable organopolysiloxane resin microparticles (2) (vinyl group content=0 mass %);
7.0 g of non-hot-meltable organopolysiloxane resin microparticles (1) (vinyl group content=1.91 mass %);
32.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);
0.65 g of organohydrogenpolysiloxane resin represented by the formula:

$$(HMe_2SiO_{1/2})_{0.67}(SiO_{4/2})_{0.33}$$

(silcon-bonded hydrogen atom content = 0.95% by mass)

{an amount such that the silicon-bonded hydrogen atom in the organohydrogenpolysiloxane resin is 1.1 mol relative to 1 mol of vinyl groups in the organopolysiloxane resin microparticle particles (1) and dimethylpolysiloxane capped at both molecular terminals with dimethylvinylsiloxy groups};
1.1 g of bis(trimethoxysilylpropoxymethyl)vinylsilatrane;
273.0 g of alumina (AES-12 from Sumitomo Chemicals) having an average particle size of 0.44 μm; and
1-ethynyl-1-cyclohexanol (amount to make 1,000 ppm in mass units relative to this composition)
were batch fed into a small grinder and stirred for 1 minute at room temperature (25° C.) to prepare a uniform granular curable silicone composition. The measurement results of the softening point and other properties of this composition are shown in Table 1.

Example 2

60.2 g of non-hot-meltable organopolysiloxane resin microparticles (2) (vinyl group content=0 mass %);
7.0 g of non-hot-meltable organopolysiloxane resin microparticles (1) (vinyl group content=1.91 mass %);
32.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);
0.65 g of organohydrogenpolysiloxane resin represented by the formula:

$$(HMe_2SiO_{1/2})_{0.67}(SiO_{4/2})_{0.33}$$

(silcon-bonded hydrogen atom content = 0.95% by mass)

{an amount such that the silicon-bonded hydrogen atom in the organohydrogenpolysiloxane resin is 1.1 mol relative to 1 mol of vinyl groups in the organopolysiloxane resin microparticle particles (1) and dimethylpolysiloxane capped at both molecular terminals with dimethylvinylsiloxy groups};
1.1 g of bis(trimethoxysilylpropoxymethyl)allylsilatrane;
273.0 g of alumina (AES-12 from Sumitomo Chemicals) having an average particle size of 0.44 μm; and
1-ethynyl-1-cyclohexanol (amount to make 1,000 ppm in mass units relative to this composition)
were batch fed into a small grinder and stirred for 1 minute at room temperature (25° C.) to prepare a uniform granular curable silicone composition. The measurement results of the softening point and other properties of this composition are shown in Table 1.

Example 3

56.4 g of non-hot-meltable organopolysiloxane resin microparticles (2) (vinyl group content=0 mass %);
10.3 g of non-hot-meltable organopolysiloxane resin microparticles (1) (vinyl group content=1.91 mass %);
33.3 g of dimethylpolysiloxane capped at both molecular terminals with dimethylvinylsiloxy groups represented by the formula:

$ViMe_2SiO(Me_2SiO)_{800}SiViMe_2$ (vinyl group content = 0.09% by mass);

1.57 g of organohydrogenpolysiloxane expressed by the formula:

$$Me_3SiO(MeHSiO)_7(Me_2SiO)_{6.5}SiMe_3$$

{an amount such that the silicon-bonded hydrogen atom in the organohydrogenpolysiloxane resin is 1.3 mol relative to 1 mol of vinyl groups in the organopolysiloxane resin microparticle particles (1) and dimethylpolysiloxane capped at both molecular terminals with dimethylvinylsiloxy groups};
1.1 g of Carbasilatrane derivative represented by the following structural formula;

[Formula 16]

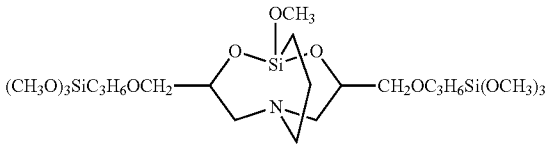

205.0 g of alumina (AES-12 from Sumitomo Chemicals) having an average particle size of 0.44 μm; and 1-ethynyl-1-cyclohexanol (amount to make 1,000 ppm in mass units relative to this composition)

were batch fed into a small grinder and stirred for 1 minute at room temperature (25° C.) to prepare a uniform granular curable silicone composition. The measurement results of the softening point and other properties of this composition are shown in Table 1.

Comparative Example 1

60.2 g of non-hot-meltable organopolysiloxane resin microparticles (2) (vinyl group content=0 mass %);

7.0 g of non-hot-meltable organopolysiloxane resin microparticles (1) (vinyl group content=1.91 mass %);

32.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);

0.65 g of organohydrogenpolysiloxane resin represented by the formula:

$$(HMe_2SiO_{1/2})_{0.67}(SiO_{4/2})_{0.33}$$

(silicon-bonded hydrogen atom content = 0.95% by mass)

{an amount such that the silicon-bonded hydrogen atom in the organohydrogenpolysiloxane resin is 1.1 mol relative to 1 mol of vinyl groups in the organopolysiloxane resin microparticle particles (1) and dimethylpolysiloxane capped at both molecular terminals with dimethylvinylsiloxy groups};

1.1 g of condensation reaction product of methylvinylsiloxane oligomer capped at both molecular terminals with silanol groups and 3-glycidoxypropyltrimethoxysilane having a viscosity of 30 mPa-s at 25° C.;

273.0 g of alumina (AES-12 manufactured by Sumitomo Chemical) having an average particle diameter of 0.44 μm; and 1-ethynyl-1-cyclohexanol (1,000 ppm in mass units relative to this composition), were batch fed into a small grinder and stirring was performed for one minute at room temperature (25° C.) to prepare a uniform granular curable silicone composition.

The measurement results of the softening point and other properties of this composition are shown in Table 1.

Comparative Example 2

60.2 g of non-hot-meltable organopolysiloxane resin microparticles (1) (vinyl group content=0 mass %);

7.0 g of non-hot-meltable organopolysiloxane resin microparticles (1) (vinyl group content=1.91 mass %);

32.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);

0.65 g of organohydrogenpolysiloxane resin represented by the formula:

$(HMe_2SiO_{1/2})_{0.67}(SiO_{4/2})_{0.33}$ (silicon-bonded hydrogen atom content = 0.95% by mass)

{an amount such that the silicon-bonded hydrogen atom in the organohydrogenpolysiloxane resin is 1.1 mol relative to 1 mol of vinyl groups in the organopolysiloxane resin microparticle particles (1) and dimethylpolysiloxane capped at both molecular terminals with dimethylvinylsiloxy groups};

1.1 g of 3-Glycidoxypropyltrimethoxysilane;

273.0 g of alumina with and average particle diameter of 0.44 μm (AES-12 from manufactured by Sumitomo Chemical); and 1-ethynyl-1-cyclohexanol (amount to make 1,000 ppm in mass units relative to this composition), were batch fed into a small grinder and stirred for 1 minute at room temperature (25° C.) to prepare a uniform curable granular silicone composition. The measurement results of the softening point and other properties of this composition are shown in Table 1.

Comparative Example 3

56.4 g of non-hot-meltable organopolysiloxane resin microparticles (2) (vinyl group content=0 mass %);

10.3 g of non-hot-meltable organopolysiloxane resin microparticles (1) (vinyl group content=1.91 mass %);

33.3 g of dimethylpolysiloxane capped at both molecular terminals with dimethylvinylsiloxy groups represented by the formula:

$ViMe_2SiO(Me_2SiO)_{800}SiViMe_2$ (vinyl group content = 0.09% by mass);

1.57 g of organohydrogenpolysiloxane expressed by the formula:

$$Me_3SiO(MeSiO)_7(Me_2SiO)_{6.5}SiMe_3$$

{an amount such that the silicon-bonded hydrogen atom in the organohydrogenpolysiloxane resin is 1.3 mol relative to 1 mol of vinyl groups in the organopolysiloxane resin microparticle particles (1) and dimethylpolysiloxane capped at both molecular terminals with dimethylvinylsiloxy groups};

1.1 g of polysiloxane containing an epoxy group represented by:

$(Me_2ViSiO_{1/2})_{0.2}(MeEpSiO_{2/2})_{0.25}(PhSiO_{3/2})_{0.55}(HO_{1/2})_{0.005}$;

205.0 g of alumina (AES-12 from Sumitomo Chemicals) having an average particle size of 0.44 μm; and 1-ethynyl-1-cyclohexanol (amount to make 1,000 ppm in mass units relative to this composition)

were batch fed into a small grinder and stirred for 1 minute at room temperature (25° C.) to prepare a uniform granular curable silicone composition. The measurement results of the softening point and other properties of this composition are shown in Table 1.

Comparative Example 4

56.4 g of non-hot-meltable organopolysiloxane resin microparticles (2) (vinyl group content=0 mass %);

10.3 g of non-hot-meltable organopolysiloxane resin microparticles (1) (vinyl group content=1.91 mass %);

33.3 g of dimethylpolysiloxane capped at both molecular terminals with dimethylvinylsiloxy groups represented by the formula:

$ViMe_2SiO(Me_2SiO)_{800}SiViMe_2$ (vinyl group content = 0.09% by mass);

1.57 g of organohydrogenpolysiloxane expressed by the formula:

$Me_3SiO(MeHSiO)_7(Me_2SiO)_{6.5}SiMe_3$

{an amount such that the silicon-bonded hydrogen atom in the organohydrogenpolysiloxane resin is 1.3 mol relative to 1 mol of vinyl groups in the organopolysiloxane resin microparticle particles (1) and dimethylpolysiloxane capped at both molecular terminals with dimethylvinylsiloxy groups};

1.1 g of N-phenyl-3-aminopropyltrimethoxysilane;

205.0 g of alumina (AES-12 from Sumitomo Chemicals) having an average particle size of 0.44 μm; and 1-ethynyl-1-cyclohexanol (amount to make 1,000 ppm in mass units relative to this composition)

were batch fed into a small grinder and stirred for 1 minute at room temperature (25° C.) to prepare a uniform granular curable silicone composition. The measurement results of the softening point and other properties of this composition are shown in Table 1.

TABLE 1

| | | Examples | | |
|---|---|---|---|---|
| | | 1 | 2 | 3 |
| Curing temperature [° C.] | | 85 | 85 | 80 |
| Melt Viscosity [Pas] | | 120 | 120 | 80 |
| Die shear strength | vs. Al [MPa] | 5.3 | 5.1 | 5.2 |
| | vs. Ni [MPa] | 5.1 | 5.3 | 5.4 |
| | vs Au [MPa] | 5.2 | 5.2 | 5.1 |
| | vs. epoxy glass [MPa] | 5.2 | 5.1 | 5.1 |
| Storage elastic modulus [MPa] | | 165 | 160 | 170 |
| Tensile elongation rate [%] | | 220 | 230 | 180 |

| | | Comparative Examples | | | |
|---|---|---|---|---|---|
| | | 1 | 2 | 3 | 4 |
| Curing temperature [° C.] | | 85 | 85 | 80 | 80 |
| Melt Viscosity [Pas] | | 120 | 220 | 75 | 180 |
| Die shear strength | vs. Al [MPa] | 5.3 | 5.2 | 5.1 | 4.9 |
| | vs. Ni [MPa] | 2.2 | 2.1 | 3.3 | 2.6 |
| | vs Au [MPa] | 1.9 | 1.8 | 3.1 | 2.5 |
| | vs. epoxy glass [MPa] | 2.5 | 2.6 | 2.5 | 2.1 |
| Storage elastic modulus [MPa] | | 165 | 150 | 160 | 165 |
| Tensile elongation rate [%] | | 230 | 200 | 175 | 160 |

TABLE 1-continued

Summary

The curable silicone compositions of Examples 1 to 3 of the present invention had favorable hot-melt properties and formed a cured product that adhered firmly to any substrate and had moderate flexibility. For this reason, the cured product obtained using these curable silicone compositions are anticipated to enable suitable use for encapsulation of semiconductor devices where gold and epoxy glass and the like are heavily used.

On the other hand, Comparative Examples 1 to 4, which do not meet the compositional requirements of the present invention, showed favorable adhesive strength to aluminum, but did not adhere firmly to nickel, gold or epoxy glass, which are considered to be relatively difficult base materials to adhere to. When silane compounds other than silatrane derivatives were used, such as in Comparative Examples 1 and 3, the melting properties deteriorated. This is considered to be due to adverse effects of the adhesion-imparting agents on the surface treatment of the functional filler in Comparative Examples 1 and 3.

Manufacturing Example 1

The granulated curable silicone composition, such as Example 1 above, was heated to 80° C., heated and melted using a twin-screw extruder, and kneaded in the form of a semi-solid softened material, and then fed onto a release film (Biwa Liner manufactured by Takara Inc.) at a feed rate of 5 kg/hour and laminated between the two release films. The laminate body was then stretched between rolls to form a laminate body in which a hot-melt curable silicone sheet having a thickness of 500 μm was laminated between two peelable films, and the entire laminate body was cooled by a cooling roll set at −15° C. In said laminate body, a flat and homogeneous hot-meltable curable silicone sheet was obtained by separating the release film.

Manufacturing Example 2

The granulated curable silicone compositions of Example 1 and the like described above were heated to 80° C., melted and kneaded using a twin-screw extruder, and formed into a sheet shape using a T-type die (opening dimensions: 800 μm×100 mm, heated to 80° C.), and then fed onto a release film (Biwa Liner manufactured by Takara Inc.) at a feed rate of 5 kg/hour. The entire sheet was cooled by a cooling roll set at −15° C., and then laminated between the two release films. The laminate body was then stretched between rolls to form a laminate body in which a hot-melt curable silicone sheet having a thickness of 500 μm was laminated between two peelable films. In said laminate body, a flat and homogeneous hot-meltable curable silicone sheet was obtained by separating the release film.

The invention claimed is:

1. A curable silicone composition that is solid at 25° C. and has hot-melt properties at a temperature of 200° C. or lower, comprising:

(A1) an organopolysiloxane resin component having no hot-melt properties as a whole molecule and where 20 mol % or more of the total siloxane units of the organopolysiloxane resin component is siloxane units represented by $SiO_{4/2}$, wherein “no hot-melt properties" means that component (A1), alone, does not exhibit heat melting behavior at a temperature of 200° C. or lower, and does not have a softening point and melt viscosity;

(A2) a straight- or branched-chain organopolysiloxane, liquid at 25° C., having at least two curing-reactive functional groups containing a carbon-carbon double bond in the molecule;

(B) one or more adhesion promoters selected from silatrane derivatives and carbasilatrane derivatives;

(C) a curing agent; and (D) functional inorganic filler;

wherein the content of component (D) is 10% or more by volume relative to the entire composition; and wherein "has hot-melt properties" means having a softening point of 50° C. or higher, and, at 150° C., having melt viscosity of less than 1,000 Pa·s, and having flowing properties; and wherein "softening point" means the temperature at which the deformation amount in the height direction is 1 mm or more, and the melt viscosity is measured using a Koka-type flow tester.

2. The curable silicone composition according to claim 1, wherein the tensile elongation rate of a cured product formed from the curable silicone composition, as measured using the method specified in JIS K 6251-2010, is 50% or more.

3. The curable silicone composition according to claim 2, wherein at least part or all of component (A1) is an organopolysiloxane resin mixture comprising:

(A1-1) a first organopolysiloxane resin that does not have hot-melt properties as a whole molecule, does not have a curing reactive functional group containing a carbon-carbon double bond in the molecule, and where 20 mol % or more of the total siloxane units of the first organopolysiloxane resin is siloxane units represented by $SiO_{4/2}$, and (A1-2) a second organopolysiloxane resin that does not have hot-melt properties as a whole molecule, has at least one curing-reactive functional group containing a carbon-carbon double bond in the molecule, and where 20 mol % or more of the total siloxane units of the second organopolysiloxane resin is siloxane units represented by $SiO_{4/2}$.

4. The curable silicone composition according to claim 1, wherein component (A2) is a straight-chain diorganopolysiloxane represented by the following structural formula:

$$R^4_3SiO(SiR^4_2O)_kSiR^4_3$$

where each $R^4$ is independently a monovalent hydrocarbon group having 1 to 10 carbon atoms, except that at least two of the $R^4$ in one molecule are alkenyl groups, and k is a number from 20 to 5,000.

5. The curable silicone composition according to claim 1, comprising:

(A1) 100 mass parts of the organopolysiloxane resin component containing the following component (A1-1) and component (A1-2) in a mass ratio of 100:0 to 25:75;

(A1-1) a first organopolysiloxane resin that does not have hot-melt properties as a whole molecule, does not have a curing reactive functional group containing a carbon-carbon double bond in the molecule, and where 20 mol % or more of the total siloxane units of the first organopolysiloxane resin is siloxane units represented by $SiO_{4/2}$;

(A1-2) a second organopolysiloxane resin that does not have hot-melt properties as a whole molecule, has a curing reactive functional group containing a carbon-carbon double bond in the molecule, and where 20 mol % or more of the total siloxane units of the second organopolysiloxane resin is siloxane units represented by $SiO_{4/2}$; and (A2-1) 10 to 200 mass parts of a straight-chain diorganopolysiloxane represented by the following structural formula:

$$R^4_3SiO(SiR^4_2O)_kSiR^4_3$$

where each $R^4$ is independently a monovalent hydrocarbon group having 1 to 10 carbon atoms, except that at least two of the $R^4$ in one molecule are alkenyl groups, and k is a number from 20 to 5,000.

6. The curable silicone composition according to claim 1, wherein component (A1) is a spherical resin microparticle having an average primary particle diameter of 1 to 10 μm.

7. The curable silicone composition according to claim 1, wherein component (B) is:

(1) a silatrane derivative represented by the following structural formula (1):

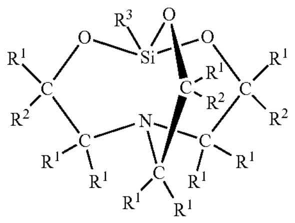

(1)

where $R^1$ is the same or different hydrogen atom or alkyl group, $R^2$ is a hydrogen atom, an alkyl group, or the same or different groups selected from alkoxysilyl group-containing organic groups represented by the general formula: $—R^4—Si(OR^5)_xR^6_{(3-x)}$ where $R^4$ is a divalent organic group, $R^5$ is an alkyl group having 1 to 10 carbon atoms, $R^6$ is a substituted or unsubstituted monovalent hydrocarbon group, and x is 1, 2, or 3; however, at least one of $R^2$ is this alkoxysilyl group-containing organic group, and $R^3$ is a group selected from a substituted or unsubstituted monovalent hydrocarbon group, an alkoxy group having 1 to 10 carbon atoms, a glycidoxyalkyl group, an oxiranylalkyl group, an acyloxyalkyl group, or an alkenyl group; or (2) one or more carbasilatrane derivatives represented by the following structural formula (2):

(2)

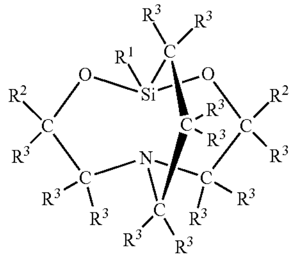

where $R^1$ is an alkyl group, an alkenyl group, or an alkoxy group, and $R^2$ is the same or different group selected from the collection of groups represented by the general formulae:

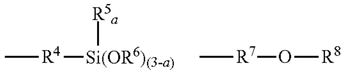

where $R^4$ is an alkylene group or alkyleneoxyalkylene group, $R^5$ is a monovalent hydrocarbon group, $R^6$ is an alkyl group, $R^7$ is an alkylene group, $R^8$ is an alkyl group, alkenyl group, or acyl group, and a is 0, 1, or 2, and $R^3$ is the same or different hydrogen atom or alkyl group.

8. The curable silicone composition according to claim 1, wherein component (C) is one or more curing agents selected from (c1) or (c2) below, in an amount necessary to cure the composition:

(c1) an organic peroxide;

(c2) an organohydrogenpolysiloxane having at least two silicon-bonded hydrogen atoms in the molecule and a hydrosilylation reaction catalyst.

9. The curable silicone composition according to claim 1, wherein component (D) is selected from the group consisting of a reinforcing filler, a white pigment, a thermally conductive filler, an electrically conductive filler, a phosphor, and a mixture of at least two of these.

10. The curable silicone composition according to claim 1, in a granular, pellet, or sheet form.

11. A substantially flat, 10 to 1,000 μm thick, curable silicone composition sheet formed from the curable silicone composition according to claim 1.

12. A film-like adhesive, comprising the curable silicone composition sheet according to claim 11.

13. A releasable laminate, comprising:

the curable silicone composition sheet according to claim 11, and a sheet-like substrate with a release surface facing the curable silicone composition sheet on one or both surfaces of the curable silicone composition sheet.

14. A cured product obtained by curing the curable silicone composition according to claim 1.

15. A semiconductor device or a member for a semiconductor device, the semiconductor device or member thereof comprising the cured product according to claim 14.

16. A method for manufacturing the curable silicone composition according to claim 1, wherein each component that makes up the curable silicone composition is granulated by mixing under temperature conditions not exceeding 50° C.

17. A method of molding a cured product, comprising the following steps:

(I) heating the curable silicone composition in the form of pellets or sheets according to claim 10 to a temperature of 100° C. or higher to melt;

(II) injecting the curable silicone composition in a liquid state obtained in step (I) into a mold or distributing the curable silicone composition obtained in step (I) to a mold by clamping; and (III) curing the curable silicone composition injected or distributed in step (II).

18. A method for molding a cured product, comprising a coating process for overmolding and underfilling a semiconductor device using a cured product formed from the curable silicone composition according to claim 1; optionally, the method comprising:

covering a surface of a semiconductor wafer substrate on which a single or plurality of semiconductor devices are mounted with a cured product produced by curing the curable silicone composition; and overmolding so that a gap between the semiconductor devices is filled with the cured product.

19. A method for manufacturing the curable silicone composition sheet according to claim 11, comprising the following steps:

1) Mixing raw material components of the curable silicone composition at a temperature of 50° C. or higher;

2) kneading a mixture obtained in step 1) while heating and melting;

3) Laminating a heated and melted mixture obtained in step 2) between films provided with at least one release surface; and 4) Extending a laminate body obtained in step 3) between rollers to mold a curable silicone sheet having a specific film thickness.

* * * * *